US009818485B2

(12) United States Patent
Oh et al.

(10) Patent No.: US 9,818,485 B2
(45) Date of Patent: Nov. 14, 2017

(54) NONVOLATLE MEMORY DEVICE AND MEMORY SYSTEM HAVING THE SAME, AND RELATED MEMORY MANAGEMENT, ERASE AND PROGRAMMING METHODS

(71) Applicant: SAMSUNG ELECTRONICS CO., LTD., Suwon-si, Gyeonggi-Do (KR)

(72) Inventors: Eun Chu Oh, Hwaseong-si (KR); Jongha Kim, Seongnam-si (KR); Junjin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/178,135

(22) Filed: Jun. 9, 2016

(65) Prior Publication Data
US 2016/0293263 A1    Oct. 6, 2016

Related U.S. Application Data

(62) Division of application No. 13/938,273, filed on Jul. 10, 2013, now Pat. No. 9,390,001.

(30) Foreign Application Priority Data

Jul. 11, 2012    (KR) .......................... 10-2012-0075596

(51) Int. Cl.
*G11C 16/16*    (2006.01)
*G06F 12/02*    (2006.01)
(Continued)

(52) U.S. Cl.
CPC .......... *G11C 16/16* (2013.01); *G06F 12/0246* (2013.01); *G06F 12/0253* (2013.01); *G11C 11/5671* (2013.01); *G11C 16/0416* (2013.01); *G11C 16/0466* (2013.01); *G11C 16/3445* (2013.01); *G06F 2212/7205* (2013.01)

(58) Field of Classification Search
None
See application file for complete search history.

(56) References Cited

U.S. PATENT DOCUMENTS 5,270,979 A * 12/1993 Harari .................... G11C 16/26
                                                  365/185.09
5,917,757 A    6/1999 Lee et al.
(Continued)

FOREIGN PATENT DOCUMENTS

JP    2002216487 A    8/2002
JP    2003022687       1/2003
(Continued)

*Primary Examiner* — Brian Peugh
*Assistant Examiner* — Dustin Bone
(74) *Attorney, Agent, or Firm* — Volentine & Whitt, PLLC

(57) ABSTRACT

An erase method of a nonvolatile memory device includes setting an erase mode, and performing one of a normal erase operation and a quick erase operation according to the set erase mode. The normal erase operation is performed to set a threshold voltage of a memory cell to an erase state which is lower than a first erase verification level. The quick erase operation is performed to set a threshold voltage of a memory cell to a pseudo erase state which is lower than a second erase verification level. The second erase verification level is higher than the first erase verification level.

19 Claims, 26 Drawing Sheets

(51) Int. Cl.
    *G11C 16/34*         (2006.01)
    *G11C 16/04*         (2006.01)
    *G11C 11/56*         (2006.01)

(56) References Cited

U.S. PATENT DOCUMENTS

| | | |
|---|---|---|
| 5,969,993 A | 10/1999 | Takeshima |
| 6,097,637 A | 8/2000 | Bauer et al. |
| 6,373,750 B1 | 4/2002 | Kurosaki |
| 6,728,133 B2 | 4/2004 | Shimizu |
| 6,954,178 B2 | 10/2005 | Winter |
| 7,050,336 B2 | 5/2006 | Tomoeda et al. |
| 7,450,417 B2 | 11/2008 | Kaneko et al. |
| 7,791,953 B2 | 9/2010 | La Rosa et al. |
| 7,802,054 B2 | 9/2010 | Park et al. |
| 7,843,155 B2 | 11/2010 | Rozman et al. |
| 8,027,194 B2 | 9/2011 | Lee et al. |
| 8,122,193 B2 | 2/2012 | Song et al. |
| 8,274,840 B2 | 9/2012 | Kim et al. |
| 8,279,670 B2 | 10/2012 | Futatsuyama et al. |
| 8,654,580 B2 | 2/2014 | Kang et al. |
| 8,797,802 B2 | 8/2014 | Hung et al. |
| 2004/0165442 A1 | 8/2004 | Lee et al. |
| 2005/0052908 A1 | 3/2005 | Tomoeda et al. |
| 2007/0106836 A1 | 5/2007 | Lee et al. |
| 2008/0198651 A1* | 8/2008 | Kim .............. G06F 12/0246 365/185.03 |
| 2010/0082890 A1 | 4/2010 | Heo et al. |
| 2010/0226183 A1 | 9/2010 | Kim |
| 2011/0051516 A1 | 3/2011 | Park |
| 2012/0102259 A1 | 4/2012 | Goss et al. |
| 2012/0102269 A1 | 4/2012 | Ono et al. |
| 2012/0155183 A1 | 6/2012 | Aritome |
| 2012/0191900 A1 | 7/2012 | Kunimatsu et al. |
| 2012/0206975 A1 | 8/2012 | Yang |
| 2012/0239858 A1 | 9/2012 | Melik-Martirosian |
| 2012/0268988 A1 | 10/2012 | Seol et al. |
| 2012/0281471 A1* | 11/2012 | Hung ............... G11C 16/0483 365/185.03 |
| 2013/0198436 A1* | 8/2013 | Bandic ............. G11C 13/0035 711/103 |
| 2013/0242665 A1 | 9/2013 | Hung et al. |

FOREIGN PATENT DOCUMENTS

| | | |
|---|---|---|
| JP | 2006018863 | 1/2006 |
| JP | 3798810 | 4/2006 |
| JP | 2007164937 A | 6/2007 |
| JP | 201165736 A | 3/2011 |
| JP | 2011-186555 A | 9/2011 |
| JP | 2012027979 A | 2/2012 |
| KR | 1020010077945 A | 8/2001 |
| KR | 1020050024248 A | 3/2005 |
| KR | 100866626 B1 | 10/2008 |
| KR | 1020090063133 A | 6/2009 |
| KR | 102009009570 A | 8/2009 |
| KR | 1020100015423 A | 2/2010 |
| KR | 1020100040487 A | 4/2010 |
| KR | 1020130087230 A | 8/2013 |

* cited by examiner

NONVOLATLE MEMORY DEVICE AND MEMORY SYSTEM HAVING THE SAME, AND RELATED MEMORY MANAGEMENT, ERASE AND PROGRAMMING METHODS

CROSS-REFERENCE TO RELATED APPLICATIONS

This is a Divisional of U.S. application Ser. No. 13/938,273, filed Jul. 10, 2013, now U.S. Pat. No. 9,390,001 issued on Jul. 12, 2016, which claims priority under 35 U.S.C. §119 to Korean Patent Application No. 10-2012-0075596 filed Jul. 11, 2012, the entire contents of both applications being incorporated herein by reference.

BACKGROUND

The inventive concepts described herein relate to a nonvolatile memory device, a memory system including the same, and to related block management, erase, and program methods.

Semiconductor memory devices are generally categorized as volatile or nonvolatile. A nonvolatile semiconductor memory device may retain data stored therein even at a power-off state, whereas avolatile memory device may loss stored data when power is interrupted.

The nonvolatile memory device may be permanent or reprogrammable, depending upon the fabrication technology used. The nonvolatile memory device may be used to store user data, program data, and microcode data in a wide variety of applications in the computer, avionics, telecommunications, and consumer electronics industries.

SUMMARY

One aspect of embodiments of the inventive concept is directed to an erase method of a nonvolatile memory device which includes setting an erase mode; and performing one of a normal erase operation and a quick erase operation according to the set erase mode. The normal erase operation is performed to set a threshold voltage of a memory cell to an erase state which is lower than a first erase verification level, and the quick erase operation is performed to set a threshold voltage of a memory cell to a pseudo erase state which is lower than a second erase verification level. The second erase verification level is higher than the first erase verification level.

Another aspect of embodiments of the inventive concept is directed to a block management method of a memory system which includes at least one nonvolatile memory device having a plurality of memory blocks and a memory controller to control the at least one nonvolatile memory device. The block management method includes performing an M-bit program operation (M being a natural number) on a memory block, and performing a quick erase operation to set threshold voltages of memory cells in the memory block to a pseudo erase state when an erase operation on the memory block is needed after the M-bit program operation. The block management method further includes performing an N-bit program operation (N being a positive integer) of the memory block using the pseudo erase state, and performing a normal erase operation to set threshold voltages of memory blocks in the memory block to an erase state when an erase operation on the memory block is needed after the N-bit program operation. The erase state is lower than a first erase verification level, the pseudo erase state is lower than a second erase verification level, and the second erase verification level is higher than the first erase verification level.

Still another aspect of embodiments of the inventive concept is directed to a program method of a memory system which includes a nonvolatile memory device and a memory controller to control the nonvolatile memory device. The program method includes receiving data and an address, determining whether an erase operation is needed, and determining whether a quick erase operation is needed when the erase operation is needed. The method further includes performing the quick erase operation to form a pseudo erase state when the quick erase operation is needed, performing a normal erase operation to form an erase state when the quick erase operation is not needed, and programming a memory block of the nonvolatile memory device corresponding to the address with the input data after the erase operation. The erase state is lower than a first erase verification level, the pseudo erase state is lower than a second erase verification level, and the second erase verification level is higher than the first erase verification level.

Still another aspect of embodiments of the inventive concept is directed to a memory system comprising at least one nonvolatile memory device, and a memory controller configured to control the at least one nonvolatile memory device. The at least one nonvolatile memory device includes a first memory cell array including first memory blocks each having a plurality of first memory cells at which page data is stored by 1-bit programming, and a second memory cell array including second memory blocks each having a plurality of second memory cells, where a plurality of page data in the first memory cell array are stored at a page of the second memory cells by multi-bit programming. The at least one nonvolatile memory device further includes control logic configured to erase the first memory blocks using one of a first erase mode and a second erase mode and to erase the second memory blocks using the second erase mode. The first erase mode is used to set the first memory cells or the second memory cells to an erase state and the second erase mode is used to set the first memory cells to a pseudo erase state. The erase state is lower than a first erase verification level, the pseudo erase state is lower than a second erase verification level, and the second erase verification level is higher than the first erase verification level.

BRIEF DESCRIPTION OF THE FIGURES

The above and other objects and features will become apparent from the description that follows with reference to the accompanying figures, wherein like reference numerals refer to like parts throughout the various figures unless otherwise specified.

DETAILED DESCRIPTION

Figure 1:
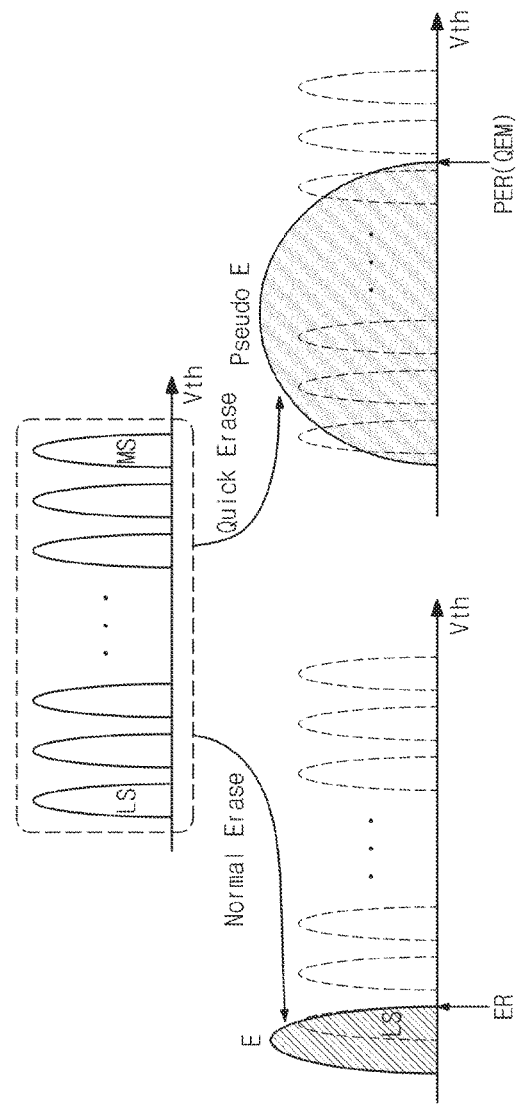
FIG. 1 is a diagram schematically illustrating an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram schematically illustrating an embodiment of the inventive concept. Referring to FIG. 1, a memory cell that has undergone a program operation may have a threshold voltage (Vth) corresponding to one of a plurality of threshold voltage states including at least two states, that is, a least state LS and a most state MS. In the figures, each state is represented by a different threshold voltage distribution. According to an embodiment of the inventive concept, prior to again programming the memory cell, either one of a normal erase operation or a quick erase operation may be performed. The quick erase operation may be referred to in other ways, such as a weak erase operation, a light erase operation, a pseudo erase operation, a rough erase operation, and so on.

At the normal erase operation, programmed states may be set to the least state LS or an erase state E having a threshold voltage which is lower than the least state LS. For example, at the normal erase operation, a threshold voltage of a memory cell may be set to be lower than a first erase verification level ER. Herein, the first erase verification level ER may be a level used to verify the least state LS.

At the quick erase operation, program states may be set to a pseudo erase state having a threshold voltage which is not higher than a second erase verification level PER. Herein, the second erase verification level PER may be higher than the first erase verification level ER. The second erase verification level PER may be referred to a quick erase margin (QEM). The quick erase margin may be adjustable when the number of program states to be stored is large or to improve the reliability of data at overwriting, after the quick erase operation.

As described above, a quick erase operation may be performed to set a threshold voltage of a memory cell to a pseudo erase state Pseudo E, or a normal erase operation may be performed to set a threshold voltage of a memory cell to an erase state E.

Figure 2:
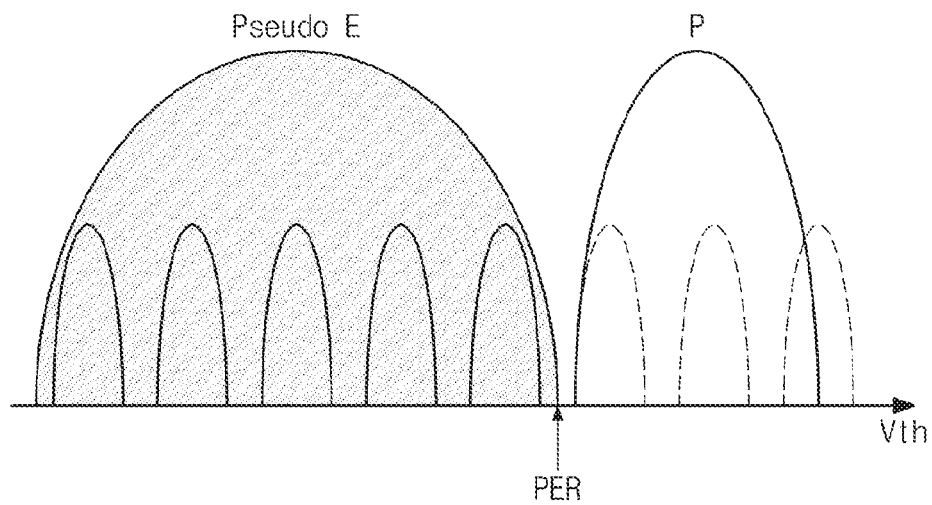
FIG. 2 is a diagram illustrating a program operation using a pseudo erase state according to an embodiment of the inventive concept.

FIG. 2 is a diagram illustrating a program operation using a pseudo erase state according to an embodiment of the inventive concept. For ease of description, it is assumed that there is performed a 3-bit program operation where eight states exist previously.

A memory cell may become a pseudo erase state Pseudo E for a next program operation. Afterwards, there may be performed a 1-bit program operation using the pseudo erase state Pseudo E. That is, the memory cell may be programmed to have one of the pseudo erase state pseudo E and a program state P. Herein, the program state P may have a threshold voltage distribution which is higher than a second erase verification level PER.

As described above, a 1-bit program operation may be performed using the pseudo erase state pseudo E.

In FIG. 2, the pseudo erase state Pseudo E may have a threshold voltage distribution which is lower than the second erase verification level PER of a previous program operation. However, the inventive concept is not limited thereto. The pseudo erase state Pseudo E of the inventive concept may have a threshold voltage distribution gathered within a predetermined period in a program operation.

Figure 3:
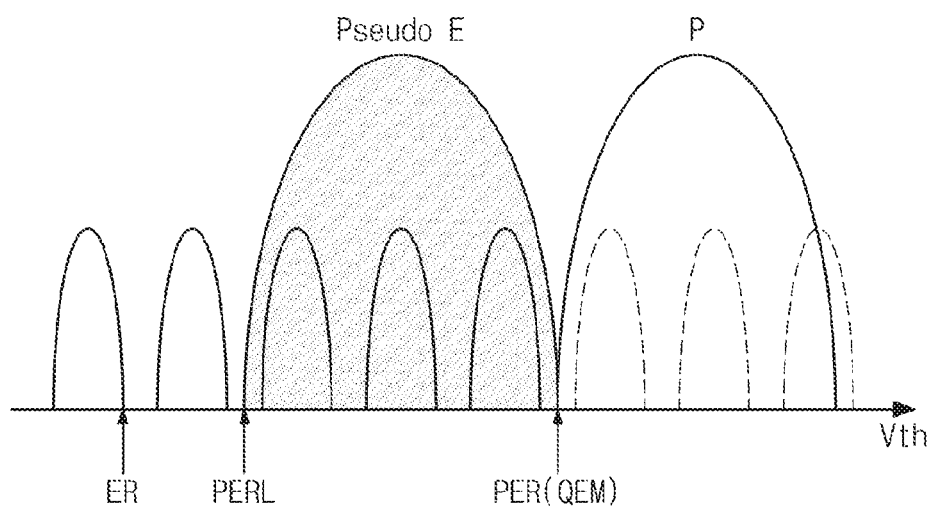
FIG. 3 is a diagram illustrating a program operation using a pseudo erase state according to another embodiment of the inventive concept.

FIG. 3 is a diagram illustrating a program operation using a pseudo erase state according to another embodiment of the inventive concept. Referring to FIG. 3, in a program operation using a pseudo erase state Pseudo E, the pseudo erase state Pseudo E may have a threshold voltage which is not higher than a second erase verification level PER and not lower than a third erase verification level PERL. Herein, the third erase verification level PERL may be higher than a first erase verification level ER and lower than the second erase verification level PER.

An example in which a 1-bit program operation is performed using the pseudo erase state Pseudo E may be described with reference to FIGS. 2 and 3. However, the inventive concept is not limited thereto. For example, it is possible to perform a 2-bit program operation using the pseudo erase state Pseudo E. For this, a quick erase margin QEM may be reduced in comparison with that at a 1-bit program operation.

Figure 4:
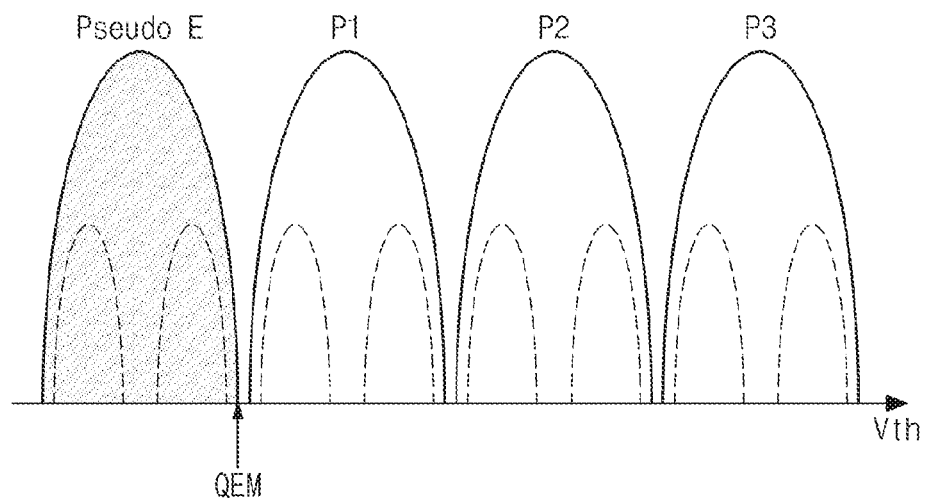
FIG. 4 is a diagram illustrating a program operation using a pseudo erase state according to still another embodiment of the inventive concept.

FIG. 4 is a diagram illustrating a program operation using a pseudo erase state according to still another embodiment of the inventive concept. Referring to FIG. 4, in a program operation using a pseudo erase state Pseudo E, a memory cell may be programmed to have one of a pseudo erase state Pseudo E and first to third program states.

Also, a program operation using a pseudo erase state Pseudo E can use an extra state. Herein, the extra state may be a state which is not used at a previous program state, and may be higher than program states programmed at the previous program operation. A detailed description relating to the extra state is disclosed in U.S. Patent Publication No. US 2012/0268988, the entire contents of which are herein incorporated by reference.

Figure 5:
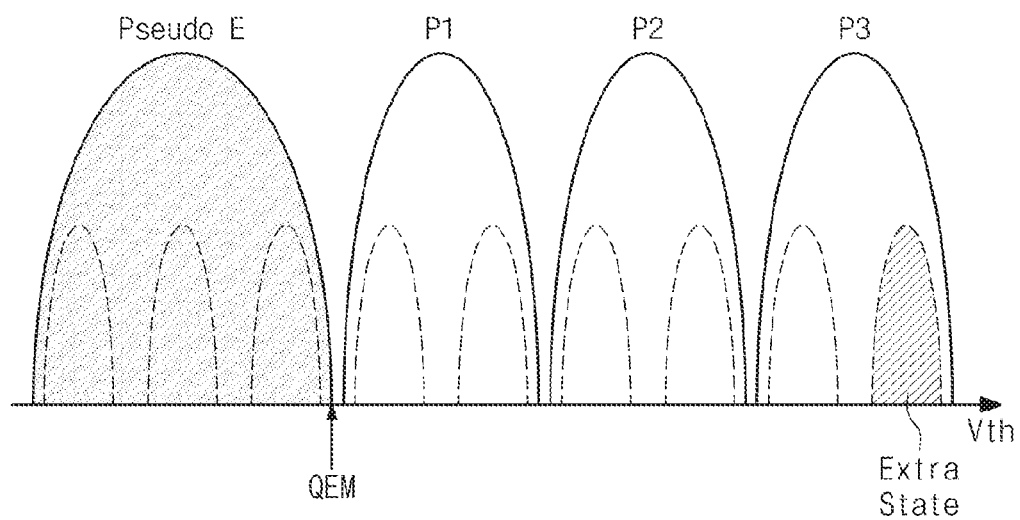
FIG. 5 is a diagram illustrating a program operation using a pseudo erase state according to still another embodiment of the inventive concept.

FIG. 5 is a diagram illustrating a program operation using a pseudo erase state according to still another embodiment of the inventive concept. Referring to FIG. 5, in a program operation using a pseudo erase state Pseudo E, a memory cell may be programmed to have one of a pseudo erase state Pseudo E and first to third program states. Herein, the third program state P3 may be an extra state.

In FIG. 5, one extra state may be included in a third program state. However, the inventive concept is not limited thereto. A program operation using a pseudo erase state Pseudo E may be applied to a case where at least one extra state is included in at least one program state.

Also, the program operation using a pseudo erase state Pseudo E may be applied to a program operation according to a multi-dimension modulation scheme. Herein, the multi-dimension modulation scheme may be a scheme in which data values to be stored are encoded and then the encoded results are programmed in continuous memory cells. A detailed description relating to the multi-dimension modulation scheme is disclosed in U.S. Patent Publication No. US 2012/0268988, the entire contents of which are herein incorporated by reference.

Figure 6:
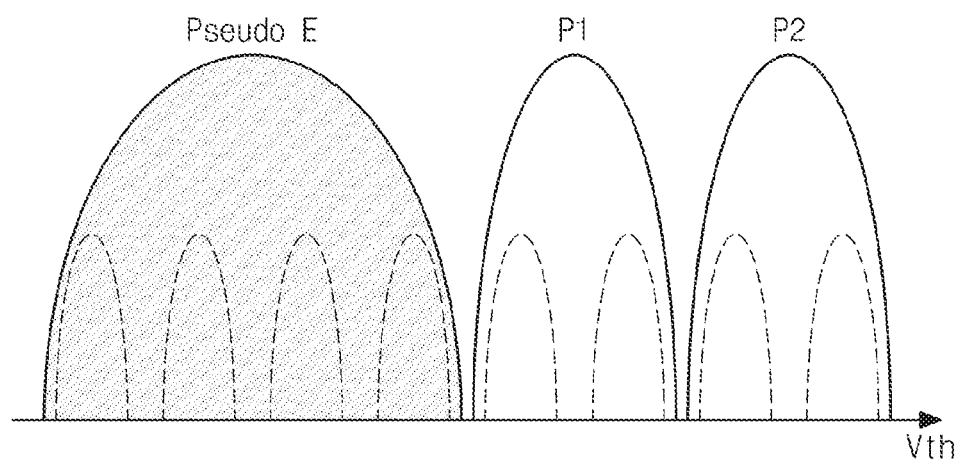
FIG. 6 is a diagram illustrating a program operation using a pseudo erase state according to still another embodiment of the inventive concept.

FIG. 6 is a diagram illustrating a program operation using a pseudo erase state according to still another embodiment of the inventive concept. Referring to FIG. 6, in a program operation using a pseudo erase state Pseudo E, a memory cell may be programmed to have one of a pseudo erase state Pseudo E and first to third program states according to a multi-dimension modulation scheme.

Figure 7:
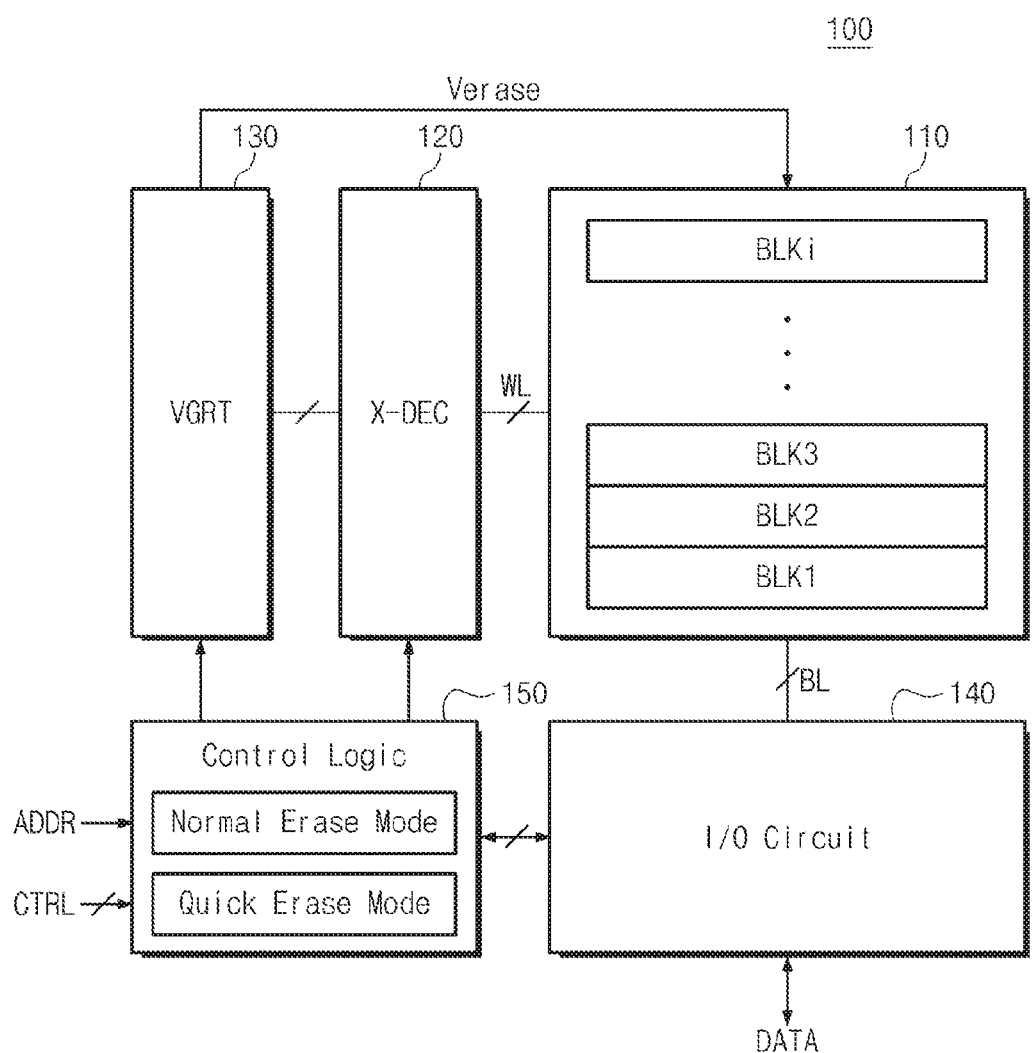
FIG. 7 is a block diagram schematically illustrating a nonvolatile memory device according to an embodiment of the inventive concept.

FIG. 7 is a block diagram schematically illustrating a nonvolatile memory device according to an embodiment of the inventive concept. Referring to FIG. 7, a nonvolatile memory device 100 may include a memory cell array 110, an address decoder 120, a voltage generating circuit 130, an input/output circuit 140, and control logic 150.

The nonvolatile memory device 100 may be a NAND flash memory device, for example. However, it is well understood that the nonvolatile memory device 100 is not limited to a NAND flash memory device. For example, the inventive concept may be applied to a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device can be implemented to have a three-dimensional array structure. In the case of NAND flash memory, a nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate. Below, by way of example, the inventive concept will be described in which the nonvolatile memory device 100 is a NAND flash memory device.

The memory cell array 110 may include a plurality of memory blocks BLK1 to BLKi (i being an integer of more than 1). Each of the memory blocks BLK1 to BLKi may include strings respectively connected to bit lines BL. Herein, each string may include at least one string selection transistor, memory cells, and at least one ground selection transistor. In each string, the string selection transistor may be driven by a voltage transferred via a string selection line, and the ground selection transistor may be driven by a voltage transferred via a ground selection line. Each of the memory cells may store at least one bit of data, and may be driven by a voltage transferred via a corresponding one of word lines WL.

The address decoder 120 may select one of the plurality of memory blocks in response to an address, and may transfer the word lines WL with word line drive voltages (e.g., a program voltage, a pass voltage, an erase voltage, a verification voltage, a read voltage, a read pass voltage, etc.).

The voltage generating circuit 130 may generate the word line drive voltages. The voltage generating circuit 130 may include a high voltage generator, a low voltage generator, and/or a negative voltage generator. Also, the voltage generating circuit 130 may generate an erase voltage for an erase operation. The erase voltage may be applied to a well of a selected one of the memory blocks BLK1 to BLKi.

In a program operation, the input/output circuit 140 may be configured to temporarily store data input from an external device and to program the temporarily stored data at a selected page. At a read operation, the input/output circuit 140 may be configured to read data from a selected page and to temporarily store the read data. The temporarily stored read data may be output to the external device. The input/output circuit 140 may include page buffers respectively corresponding to the bit lines BL.

The control logic 150 may control an overall operation of the nonvolatile memory device 100. The control logic 150 may decode control signals and commands provided from an external memory controller, and may control the address decoder 120, the voltage generating circuit 130, and the input/output circuit 140 according to a decoded result. That is, the control logic 150 may control the voltage generating circuit 130 to generate voltages needed for driving (e.g., programming, reading, erasing, etc.), the address decoder 120 to transfer the voltages to the word lines WL, and the input/output circuit 140 to transfer page data to be programmed and page data that has been read.

The control logic 150 may perform an erase operation according to a normal erase mode or an erase operation according to a quick erase mode. In the normal erase mode, a threshold voltage of a memory cell may be set to an erase state. Herein, the erase state may be a least state LS (refer to FIG. 1) or below the least state LS. In the quick erase mode, a threshold voltage of a memory cell may be set to a pseudo erase state Pseudo E. Herein, the pseudo erase state Pseudo E may be lower than a most state MS (refer to FIG. 1) and a second erase verification level PER.

In example embodiments, either one of the normal and quick erase modes may be selected by an erase mode selection command input from the external memory controller. In other example embodiments, either one of the normal and quick erase modes may be selected internally at the nonvolatile memory device 100. In still other example embodiments, either one of the normal and quick erase modes may be fixed by a manufacturer.

The nonvolatile memory device 100 of the inventive concept may perform an erase operation according to one of the normal and quick erase modes as occasion demands.

Figure 8:
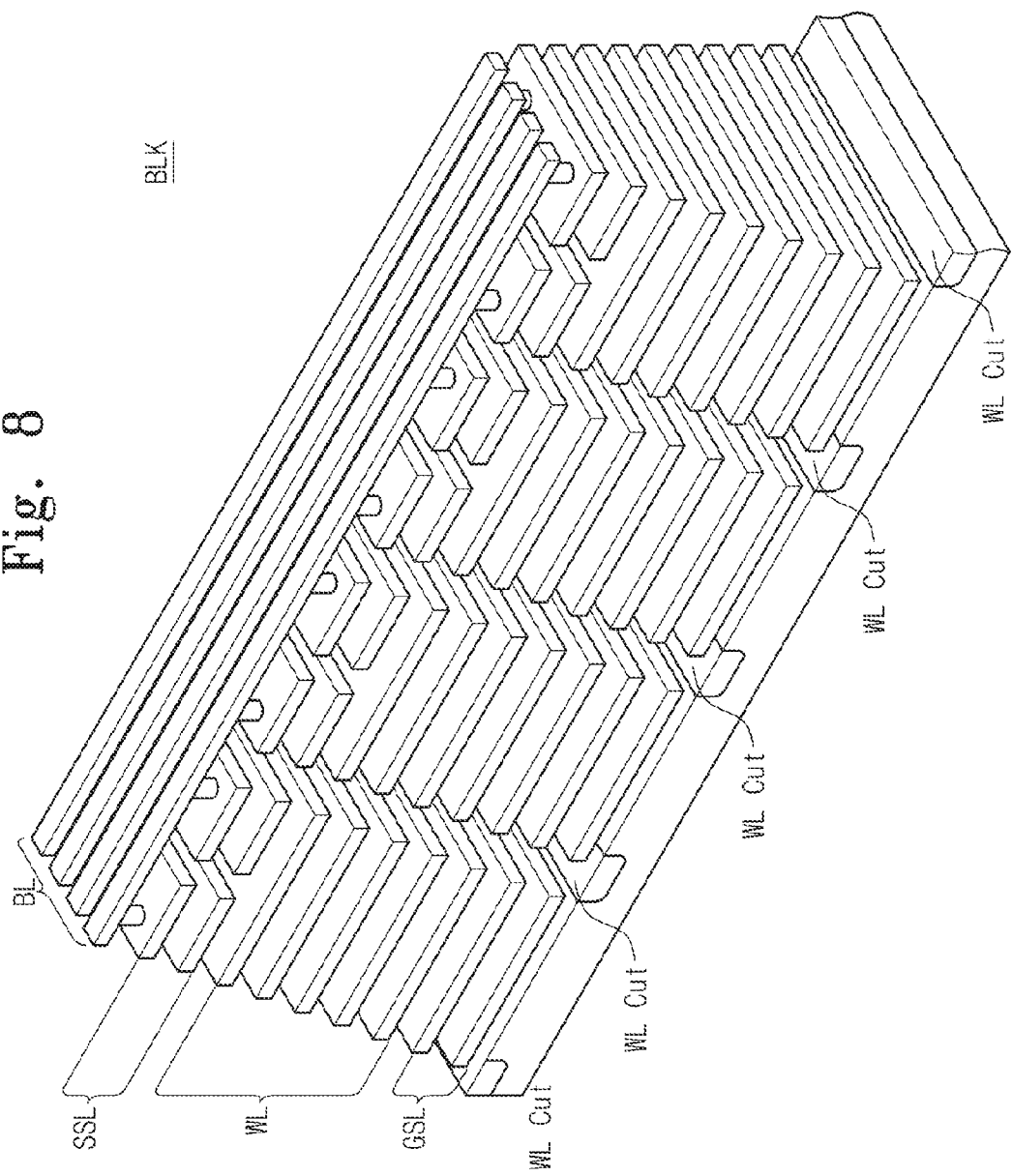
FIG. 8 is a perspective view of a memory block of FIG. 7 according to an embodiment of the inventive concept.

FIG. 8 is a perspective view of a memory block of FIG. 7 according to the inventive concept. Referring to FIG. 8, a memory block BLK may be formed in a direction perpendicular to a substrate. At least one ground selection line GSL, a plurality of word lines WL, and at least one string selection line SSL may be stacked on a substrate (or, a well) between word line cuts. Herein, the at least one string selection line SSL may be separated by a string selection line cut. A plurality of pillars may penetrate the at least one ground selection line GSL, the plurality of word lines WL, and the at least one string selection line SSL. Herein, the at least one ground selection line GSL, the plurality of word lines WL, and the at least one string selection line SSL may be formed to have a substrate shape. Bit lines BL may be connected to an upper surface of the plurality of pillars. The memory block in FIG. 8 may have a word line merged structure. However, the inventive concept is not limited thereto.

In a general three-dimensional memory device, charge trap flash memory device, or vertical NAND (VNAND), a time (hereinafter, referred to as an erase time) taken to perform an erase operation may be relatively long due to structural characteristics and/or matter properties. For example, since the VNAND performs an erase operation by a large block/sub-block unit, it may require a relatively long erase time in comparison with a planar memory device. The long erase time may cause a delay of a response time. That is, the system performance may be degraded. For example, in the case where an erase operation is performed during a write operation, the long erase time may cause a time-out of a response time to a write operation.

On the other hand, a nonvolatile memory device of the inventive concept may select one of a normal erase mode and a quick erase mode to perform an erase operation according to the selected erase mode. In the case where a response time is expected to be delayed, the nonvolatile memory device of the inventive concept may perform an erase operation using the quick erase mode to reduce the erase time. Thus, the probability that a response time of a write operation will be timed out may be reduced.

A quick erase method of the nonvolatile memory device according to the inventive concept may be implemented by changing a time (or, a cycle) at a normal erase operation.

Figure 9:
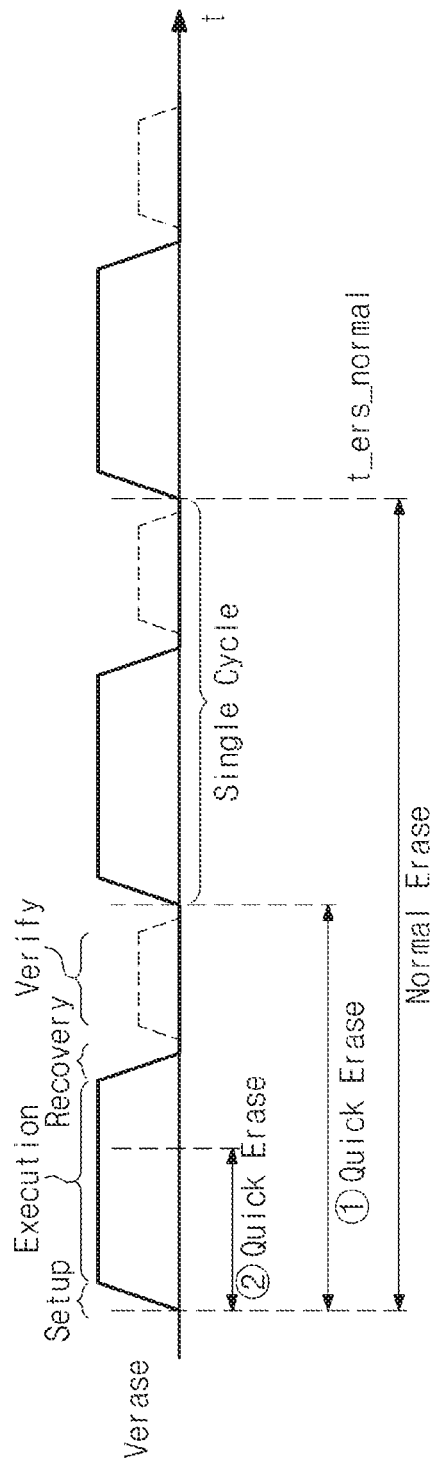
FIG. 9 is a timing diagram illustrating a quick erase method according to an embodiment of the inventive concept.

FIG. 9 is a timing diagram illustrating a quick erase method according to an embodiment of the inventive concept. For ease of description, it is assumed that a normal erase operation is formed of two cycles. Each cycle may be divided into a setup period, an execution period, a recovery period, and a verification period. In FIG. 9, a solid line may indicate a voltage applied to a well, and a dotted line may indicate a voltage applied to a word line. As illustrated in FIG. 9, a normal erase operation may be formed of two cycles. At the setup period, a ground voltage may be applied to a word line and a bit line, and a source line may be floated. At the execution period, an erase voltage Verase may be applied to a well. At the recovery period, a well voltage and a bit line voltage may be discharge. At the verification period, a verification read operation may be performed using a first verification level ER (refer to FIG. 1) to determine whether an erase operation is normally performed. Although not illustrated in FIG. 9, the erase voltage Verase may increase according to an increase in the number of cycles.

In example embodiments, a quick erase operation may be performed during a portion (e.g., one cycle) of the erase cycles defining the normal erase operation. An example of this is shown by ① in FIG. 9.

In other example embodiments, the quick erase operation may be performed during a portion of a single erase cycle of the normal erase operation. An example of this is shown by ② in FIG. 9, As described above, the quick erase operation may be performed during a part (e.g., one cycle) of the cycles defining the normal erase operation or during a part of one cycle of the normal erase operation. That is, the quick erase operation may be performed by applying the erase voltage Verase to the well during a time t_ers_quick which is shorter than an erase time of the normal erase operation t_ers_normal.

A quick erase method of the inventive concept may be implemented by changing a level of the erase voltage Verase at the normal erase operation.

Figure 10:
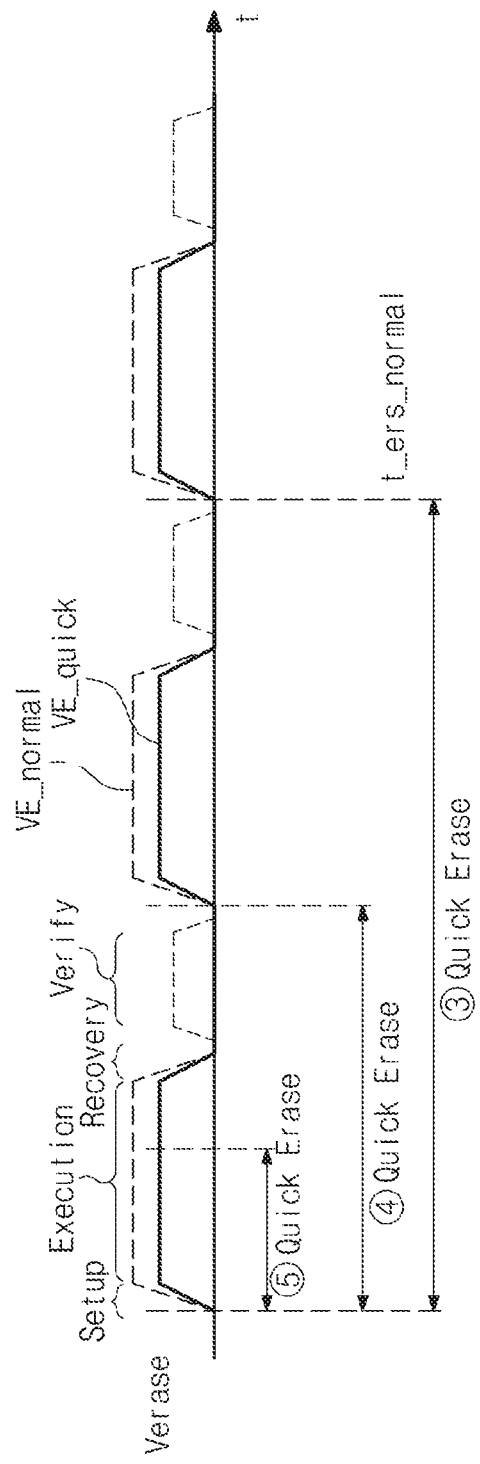
FIG. 10 is a timing diagram illustrating a quick erase method according to another embodiment of the inventive concept.

FIG. 10 is a timing diagram illustrating a quick erase method according to another embodiment of the inventive concept. Referring to FIG. 10, a quick erase method may include applying an erase voltage Verase having a level VE_quick which is lower than a level VE_normal of a normal erase operation.

In example embodiments, the quick erase operation may be performed at a same timing and during all cycles of the normal erase operation, but with the erase voltage Verase having the lower level VE_quick being applied to a well. An example of this is shown by ③ in FIG. 10.

In other example embodiments, the quick erase operation may be performed during portion of all cycles defining the normal erase, with the erase voltage Verase having the low level VE_quick being applied to a well. An example of this is shown by ④ in FIG. 10.

In still other example embodiments, the quick erase operation may be performed during a portion of a single cycle of the normal erase operation, with the erase voltage Verase having the lower level VE_quick being applied to a well. An example of this is shown by ⑤ in FIG. 10.

The quick erase method of the inventive concept may be implemented by reducing an execution period of the normal erase operation where the erase voltage Verase is applied to the well.

Figure 11:
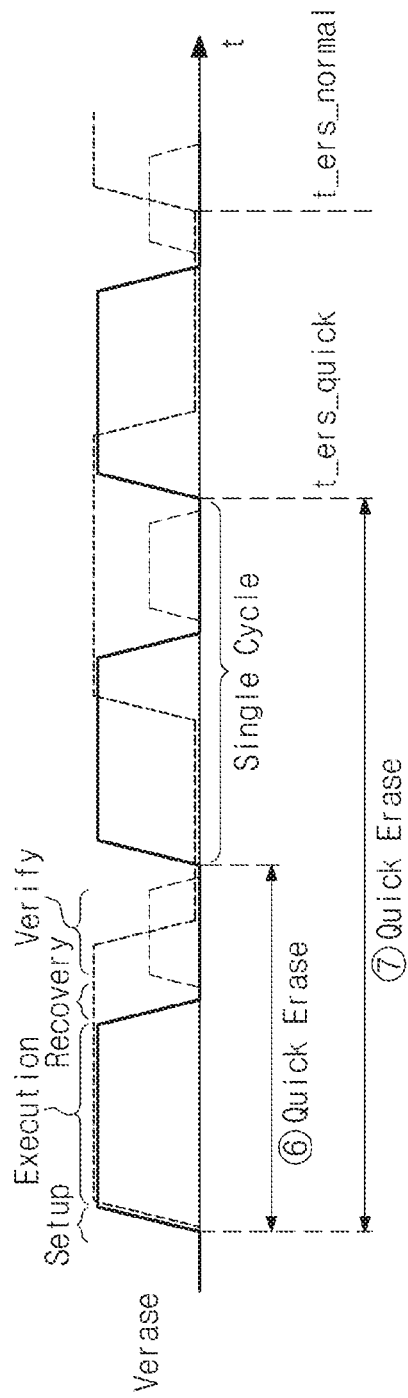
FIG. 11 is a timing diagram illustrating a quick erase method according to still another embodiment of the inventive concept.

FIG. 11 is a timing diagram illustrating a quick erase method according to still another embodiment of the inventive concept. In comparison with a quick erase method of FIG. 9, a quick erase method of FIG. 11 may reduce an execution period in which an erase voltage Verase is applied to a well. That is, a cycle of a quick erase operation may be shorter than a cycle of a normal erase operation.

In example embodiments, the number of cycles of the quick erase operation may be less than that of the normal erase operation. An example of this is shown by ⑥ in FIG. 11.

In other example embodiments, the number of cycles of the quick erase operation may be the same as that of the normal erase operation. An example of this is shown by ⑦ in FIG. 11.

A quick erase method of the inventive concept may be implemented by lowering a level of the erase voltage Verase and shortening a cycle in comparison with the normal erase operation.

Figure 12:
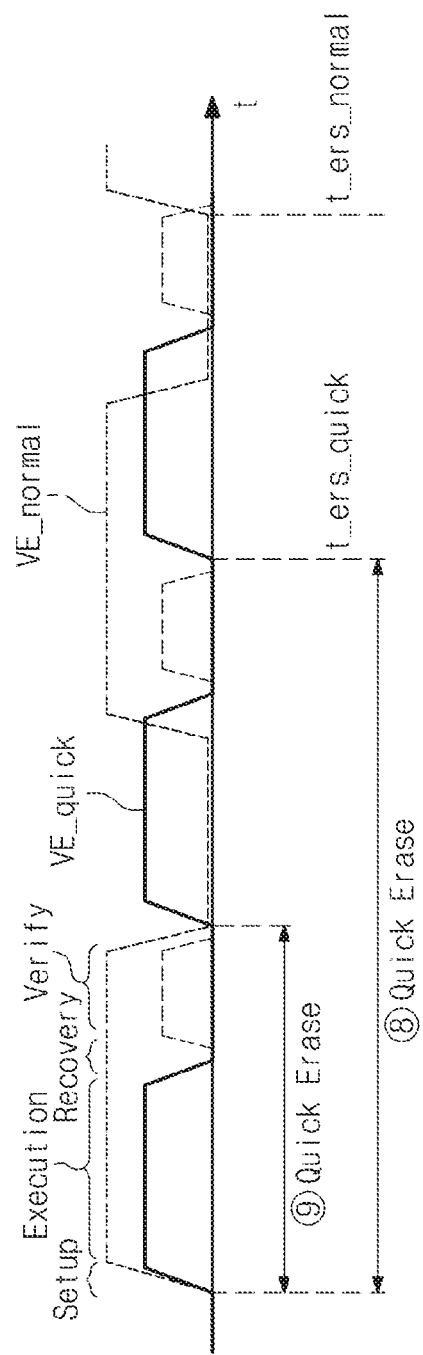
FIG. 12 is a timing diagram illustrating a quick erase method according to still another embodiment of the inventive concept.

FIG. 12 is a timing diagram illustrating a quick erase method according to still another embodiment of the inventive concept. Referring to FIG. 12, a level VE_quick of an erase voltage Verase applied at a quick erase operation may be lower than that VE_normal of a normal erase operation, and a cycle of the quick erase operation may be shorter than that of the normal erase operation.

In example embodiments, the number of cycles of the quick erase operation may be equal to that of the normal erase operation. An example of this is shown by ⑧ in FIG. 12.

In other example embodiments, the number of cycles of the quick erase operation may be less than that of the normal erase operation. An example of this is shown by ⑨ in FIG. 12.

Referring to FIGS. 9 to 12, a quick erase operation of the inventive concept may be decided according to various timing and level combinations relative to the normal erase operation to set a memory cell to a pseudo erase state Pseudo E.

Figure 13:
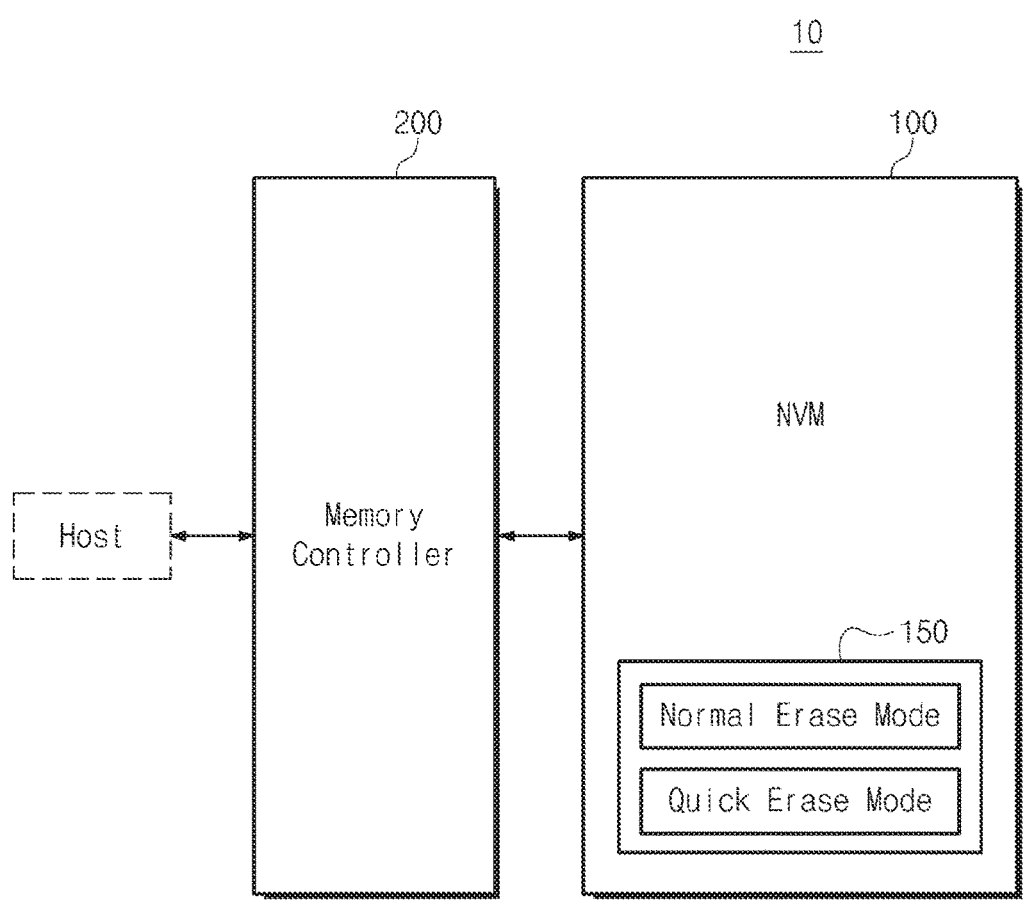
FIG. 13 is a block diagram schematically illustrating a memory system according to an embodiment of the inventive concept.

FIG. 13 is a block diagram schematically illustrating a memory system according to an embodiment of the inventive concept. Referring to FIG. 13, a memory system 10 may include at least one nonvolatile memory device 100 and a memory controller 200 to control the nonvolatile memory device 100. The nonvolatile memory device 100 may be the same as that described in FIG. 7. The memory controller 200 may determine an erase mode of the nonvolatile memory device 100 as occasion demands. For example, whether control logic 150 of the nonvolatile memory device 100 operates in a normal erase mode or in a quick erase mode may be decided by the memory controller 200.

In example embodiments, the memory controller 200 may predict a response time to a write request of a host to select a quick erase mode according to the predicted result. For example, when the write request is determined to accompany a merge operation causing a delay of the response time, the memory controller may instantly control the nonvolatile memory device 100 to operate in the quick erase mode.

In example embodiments, the memory controller 200 may select the quick erase mode in response to a request of a user. For example, if the user requires a more rapid write operation, the memory controller 200 may control the nonvolatile memory device 100 in response to such a request to operate in the quick erase mode.

Figure 14:
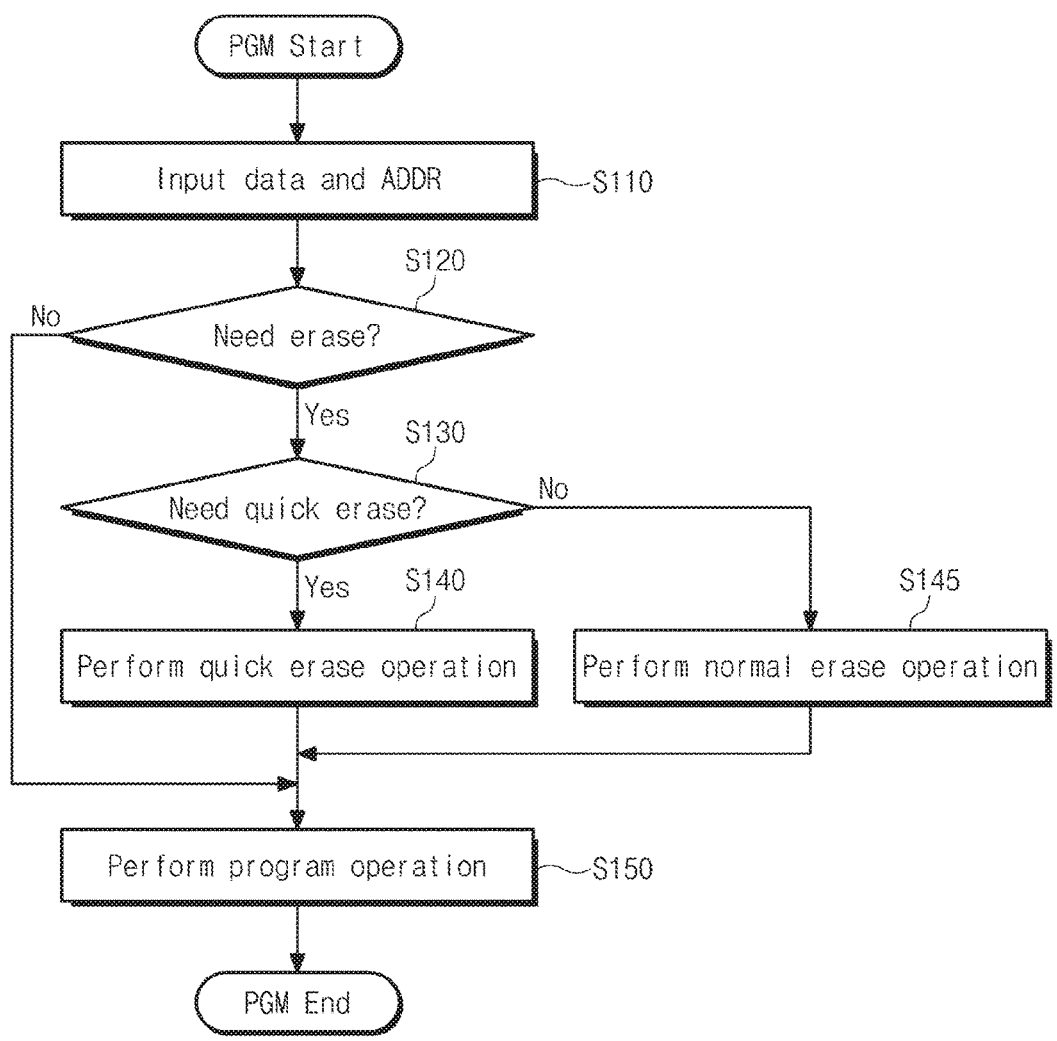
FIG. 14 is a flow chart illustrating a program method of a memory system according to an embodiment of the inventive concept.

FIG. 14 is a flow chart illustrating a program method of a memory system according to an embodiment of the inventive concept. Below, a program method will be described with reference to FIGS. 7 to 14.

In operation S110, a memory system 10 may receive data and an address (e.g., a logical address) from an external host. In operation S120, a memory controller 200 may determine whether an erase operation is required. For example, when a free block at which the data is to be written does not exist, it is necessary to make a free block by erasing a data block. Thus, an erase operation on a data block must be performed. For example, the erase operation may be necessary when a memory block having invalid data or garbage after a merge operation between memory blocks needs a free block. If the erase operation on the data block is not needed, the method proceeds to operation S150.

If the erase operation on the data block is required, the method proceeds to operation S130, in which it may be determined whether a quick erase operation is necessary. If so, the method proceeds to operation S140 in which the quick erase operation on the data block is performed. If not, the method proceeds to operation S145, in which a normal erase operation on the data block is performed. After an erase operation on the data block is completed, in operation S150, a program operation may be performed to store the received data at a memory block corresponding to the address. Afterwards, the method may be terminated.

With the program method of the inventive concept, whether the quick erase operation is necessary may be determined, and the quick erase operation may be performed according to the determination result. Thus, in comparison with a normal case, a time taken to perform a program operation may be reduced.

Figure 15:
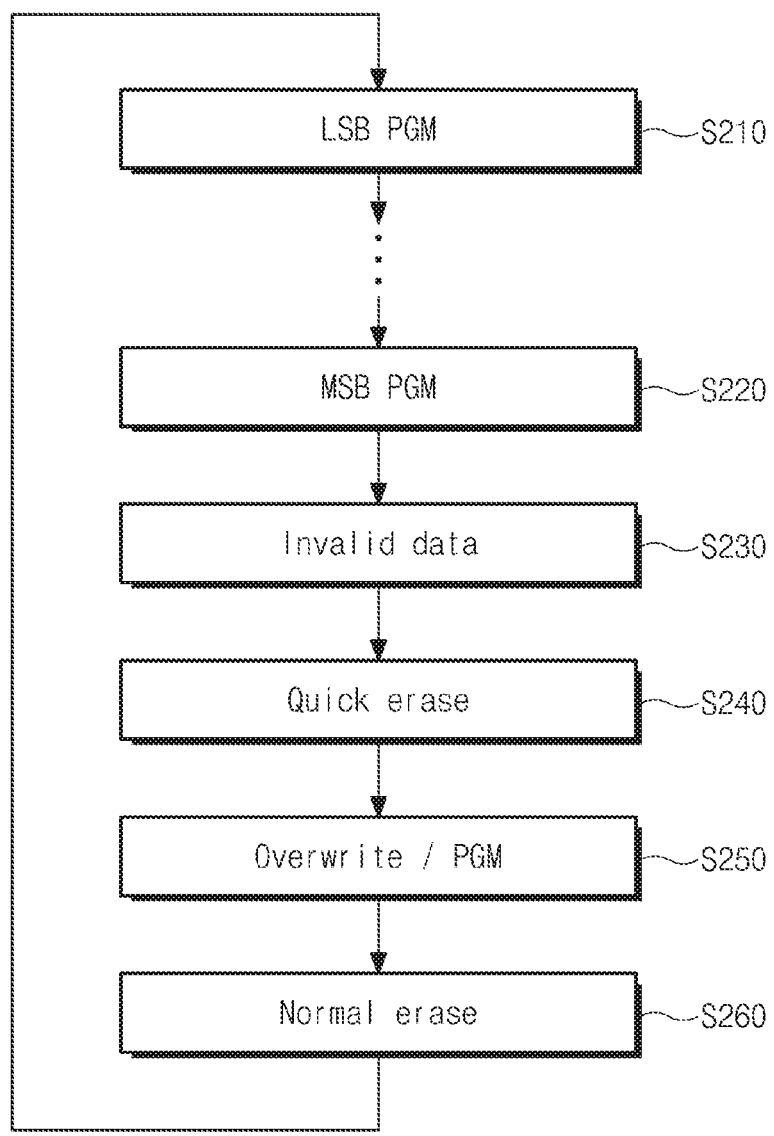
FIG. 15 is a diagram illustrating a block management method of a memory system according to an embodiment of the inventive concept.

FIG. 15 is a diagram illustrating a block management method of a memory system according to an embodiment of the inventive concept. Referring to FIG. 15, a memory controller 200 of a memory system 10 may manage memory blocks according to the order described next.

In operation S210, there may be performed a least significant bit (LSB) program operation on a page of a virgin (erased) memory block. Afterwards, in operation S220, a next bit program operation may be performed with respect to the LSB programmed page. For example, a most significant bit (MSB) program operation may be performed. In FIG. 15, there is illustrated an example in which the LSB program operation on a page of a memory block is performed and then the MSB program operation is performed. However, the inventive concept is not limited thereto. For example, the MSB program operation on a page of a memory block may be performed, and then the LSB program operation may be performed.

In FIG. 15, a multi-bit program operation may be sequentially performed one bit at a time. However, the inventive concept is not limited thereto. For example, the multi-bit program operation may be performed such that multiple bits are simultaneously programmed.

After pages of the memory block are programmed as described above, data stored at the memory block can be determined to be invalid. For example, data stored at the memory block may be invalidated according to a request of an external host. Also, after data stored at the memory block is copied to another memory block (physically distinguished from the memory block), in operation S230, previous data may be invalidated.

At this time, in operation S240, a quick erase operation may be performed with respect to the memory block storing invalid data to perform a next program operation. Herein, memory cells in the memory block quickly erased may be set to a pseudo erase state Pseudo E. In operation S250, an overwrite operation or a program operation may be performed using the pseudo erase state Pseudo E. In operation S260, a normal erase operation on the overwritten/programmed memory block may be performed to perform a normal program operation using an erase state E. Afterwards, a procedure may return to operation S210.

With the block management method of the inventive concept, a quick erase operation may be performed before a normal erase operation, and an overwrite/program operation may be performed using a pseudo erase state Pseudo E generated at the quick erase operation.

With the block management method of the inventive concept, there may be iterated the quick erase operation on one memory block.

Figure 16:
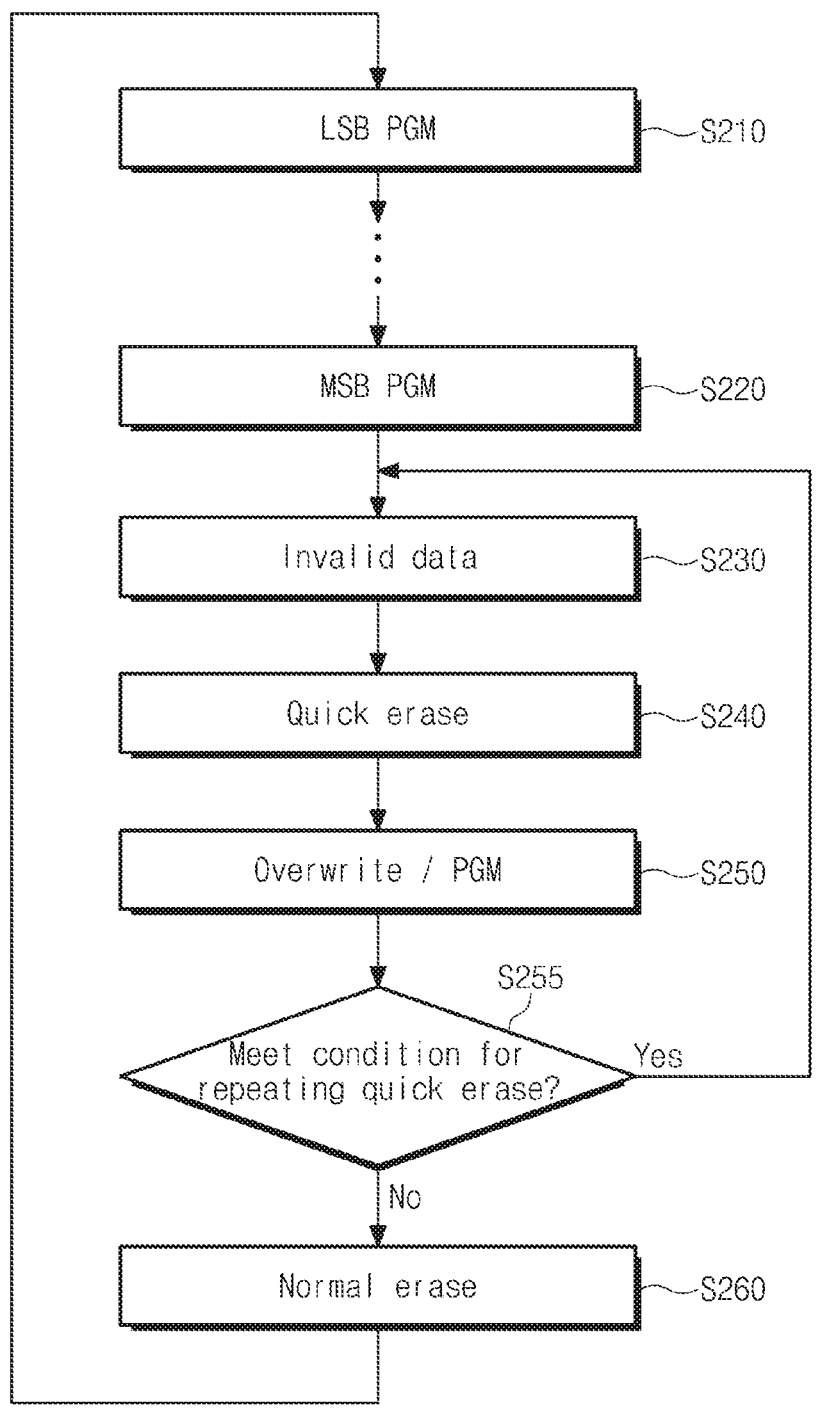
FIG. 16 is a diagram illustrating a block management method of a memory system according to another embodiment of the inventive concept.

FIG. 16 is a diagram illustrating a block management method of a memory system according to another embodiment of the inventive concept. Referring to FIG. 16, a block management method may be identical to that of FIG. 15 except that an operation S255 is added.

In operation S255, a memory controller 200 may determine whether a condition for iterating a quick erase operation on a memory block is satisfied. The condition may be information associated with a memory block. For example, the condition may be a program/erase cycle number, a block erase rate, and so on. If the condition for iteration of the quick erase operation is satisfied, for example, a program/erase cycle number or a block erase rate is less than a predetermined value, the method proceeds to operation S230 to iterate the quick erase operation on the memory block.

In example embodiments, whether to perform a quick erase operation may be decided according to a success rate of an erase operation, a program operation, or a read operation. For example, when the rate exceeds a predetermined value, the quick erase operation may be performed. Also, when the rate exceeds a predetermined value, a cell per bit number to be programmed at an overwrite operation may be decided.

In example embodiments, whenever the quick erase operation is iterated, a quick erase margin QEM may gradually decrease. In other example embodiments, although the quick erase operation is iterated, the quick erase margin QEM may be constant.

If the condition is not satisfied, the method proceeds to operation S260 to perform a normal program operation.

With the block management method of the inventive concept, the quick erase operation may be iterated according to a state of a memory block.

In FIGS. 15 and 16, the quick erase operation may be performed before a normal erase operation. However, the inventive concept is not limited thereto. The quick erase operation can be performed selectively.

Figure 17:
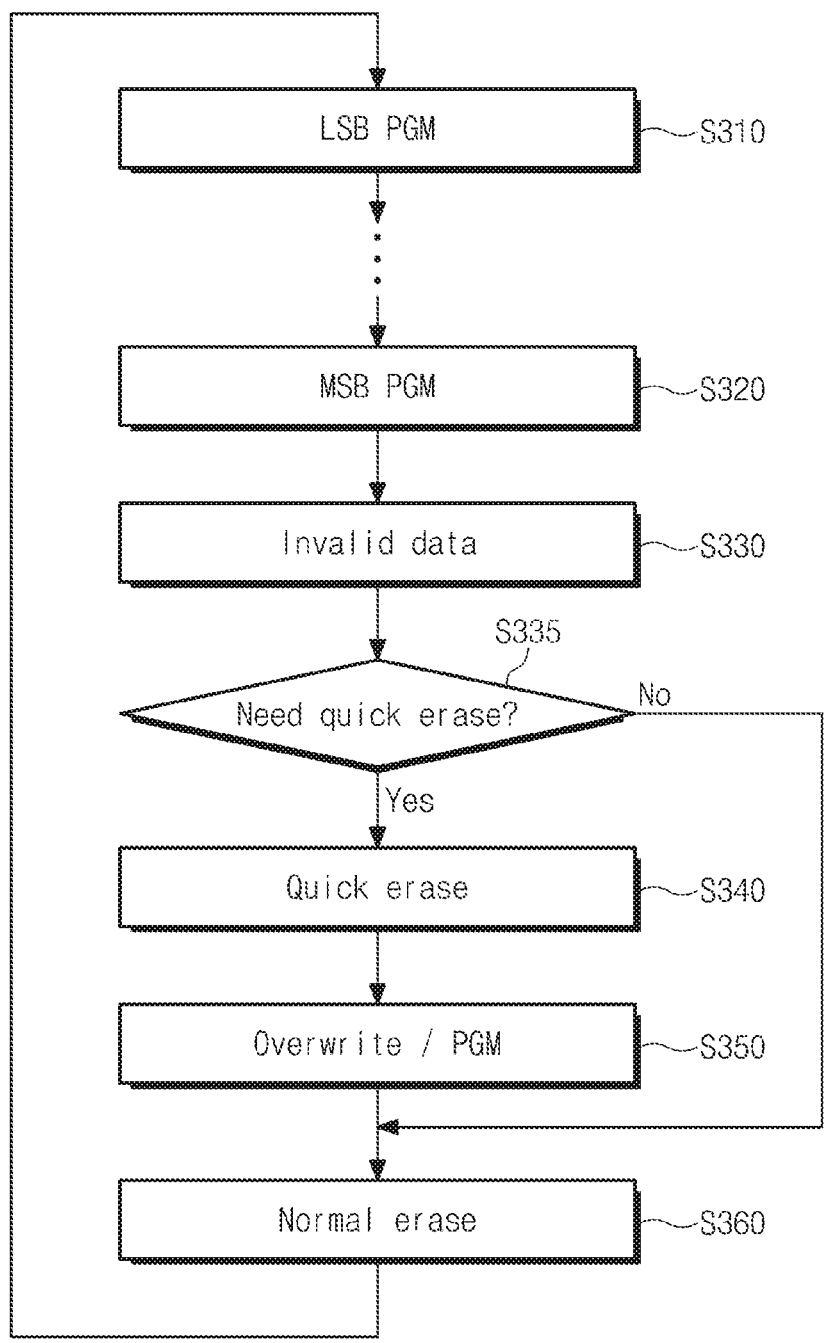
FIG. 17 is a diagram illustrating a block management method of a memory system according to still another embodiment of the inventive concept.

FIG. 17 is a diagram illustrating a block management method of a memory system according to still another embodiment of the inventive concept. Below, a block management method will be described with reference to FIG. 17.

In operation S310, an LSB program operation on a page of a memory block may be performed. In operation S320, an MSB program operation may be performed. After pages of the memory block are programmed according to the above order, in operation S330, data stored at the memory block may be determined to be invalid. In operation S335, a memory controller 200 may determine whether there is required a quick erase operation on the memory block storing the invalid data. For example, when a request of a host accompanies a fast erase operation, the memory controller 200 may control a nonvolatile memory device 100 such that a quick erase operation is performed.

If the quick erase operation is not required, the method proceeds to operation S360. On the other hand, if the quick erase operation is required, the quick erase operation may be performed to perform a next program operation of a memory block storing invalid data. Herein, memory cells in the quickly erased memory block may be set to a pseudo erase state Pseudo E (S340). For example, when a time (hereinafter, referred to as a write response time) taken to write data input at a write request at a physical space of the nonvolatile memory device 100 is predicted to exceed a predetermined value, the memory controller 200 may control the nonvolatile memory device 100 to perform the quick erase operation. Herein, the write response time may include a time taken to perform a merge operation or an erase operation.

In example embodiments, an erase time may be predicted using at least one of the number of free blocks, a block erase rate (BER), a program/erase cycle, a data retention time, and a temperature. Herein, when the block erase rate (BER) exceeds a predetermined value, the erase time may become long. Thus, the quick erase operation may be performed. Also, when the block erase rate (BER) exceeds a predetermined value, it is difficult to perform a multi-bit overwrite operation. Thus, a number of bits per cell to be programmed may be determined at an overwrite operation.

Afterwards, in operation S350, an overwrite operation or a program operation may be performed using a pseudo erase state Pseudo E. In operation S360, the memory controller 200 may perform a normal erase operation on a memory block to perform a normal program operation using the pseudo erase state Pseudo E. Then, the procedure may return to operation S310.

As described above, the quick erase operation on a memory block may be performed according to a predicted write response time.

In FIGS. 15 to 17, there is illustrated an example in which a plurality of logical pages is sequentially programmed at one physical page. However, the inventive concept is not limited thereto. The inventive concept is applicable to the case where a plurality of logical pages is simultaneously programmed at one physical page. That is, the inventive concept is applicable to an on-chip buffered program (hereinafter, referred to as OBP) scheme.

Figure 18:
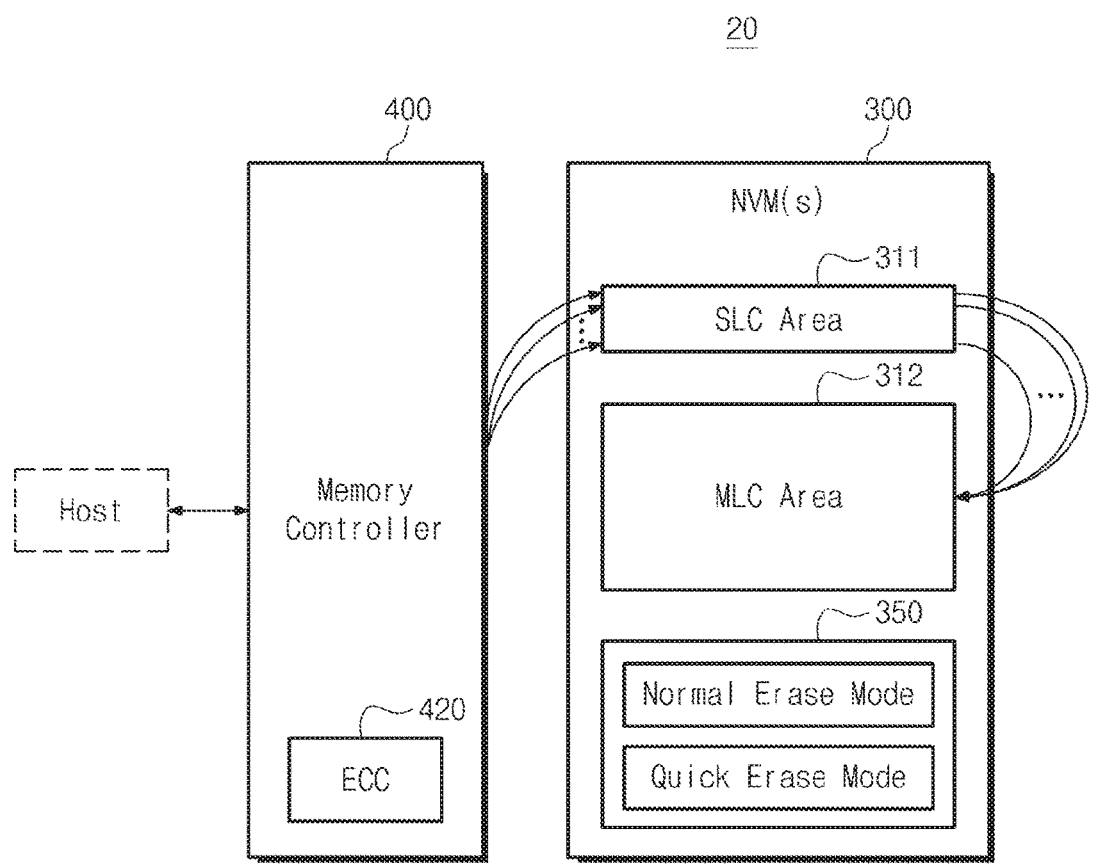
FIG. 18 is a block diagram schematically illustrating a memory system using an OBP scheme according to an embodiment of the inventive concept.

FIG. 18 is a block diagram schematically illustrating a memory system using an OBP scheme according to an embodiment of the inventive concept. Referring to FIG. 18, a memory system 20 may include at least one nonvolatile memory device 300 and a memory controller 400 to control the nonvolatile memory device 300.

The nonvolatile memory device 300 may include a single-level cell area 311 to store 1-bit per cell, a multi-level cell area 312 to store a plurality of bits per cell, and a control logic 350. The SLC area 311 stores a single page of data in the memory cells of each word line. Multiple singles pages of data from the SLC are 311 are stored as logical pages in the memory cells of a word line of the MLC area 312. Each of the single-level cell area 311 and the multi-level cell area 312 may include a plurality of memory blocks. The control logic 350 may include a normal erase mode for a normal erase operation and a quick erase mode for a quick erase operation. The memory controller 400 may an ECC circuit 420 which corrects page data read from the single-level cell area 311.

The memory system 20 may perform a quick erase operation on memory blocks of the single-level cell area 311.

In other example embodiments, the memory system 20 may selectively perform a normal erase operation or a quick erase operation with respect to one of the single-level cell area 311 and the multi-level cell area 312.

Figure 19:
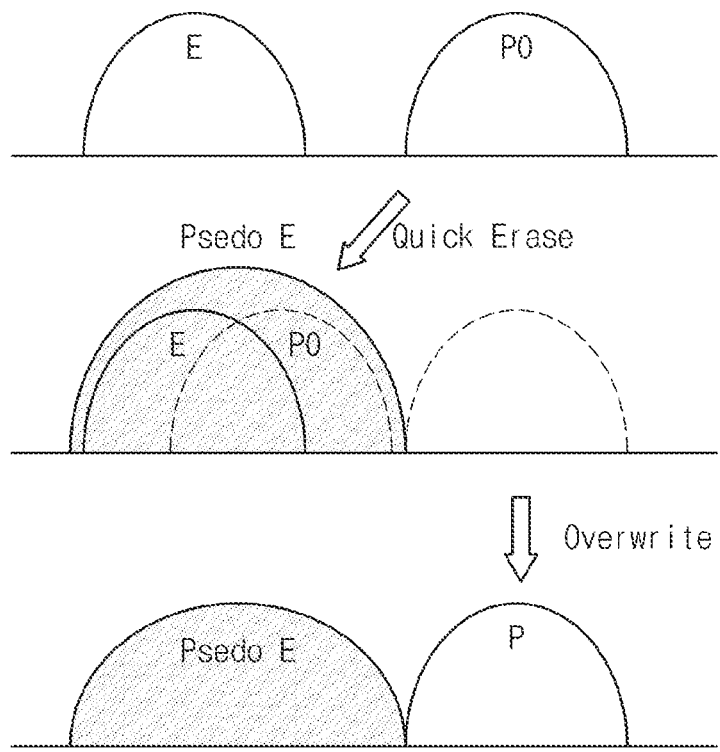
FIG. 19 is a diagram illustrating an example of a variation in a threshold voltage of a memory block in a single-level cell area of FIG. 18.

FIG. 19 is a diagram illustrating a variation in a threshold voltage of a memory block in a single-level cell area of FIG. 18.

A 1-bit program operation may be performed using an erase state E. In this case, a programmed memory cell in a memory block may have the erase state E or a program state P0. After, if an erase operation on the memory block is required, a quick erase operation may be performed. As illustrated in FIG. 19, a threshold voltage of a memory cells may decrease through a quick erase operation such that the program state P0 of a previous program operation is set to a pseudo erase state Pseudo E. After the quick erase operation, a 1-bit program operation may be performed using the pseudo erase state Pseudo E. That is, a memory cell in the memory block may be programmed to the pseudo erase state Pseudo or the program state P0.

Figure 20:
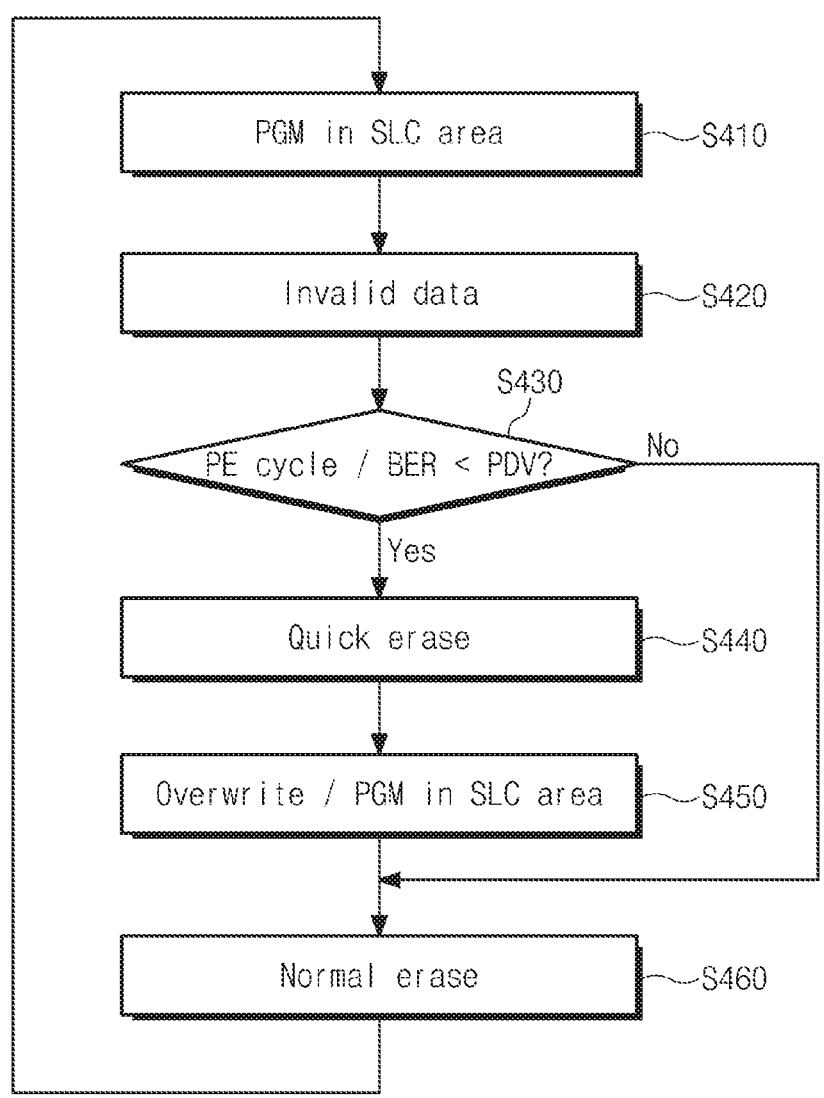
FIG. 20 is a flow chart illustrating a block management method of a memory system of FIG. 18 according to an embodiment of the inventive concept.

FIG. 20 is a flow chart illustrating a block management method of a memory system of FIG. 18.

In operation S410, a page of a memory block in a single-level cell area 311 may be programmed. In operation S420, data stored at the memory block may be decided to be invalid. In operation S430, a memory controller 400 may determine whether a program/erase cycle number or a block erase rate of the memory block storing invalid data is below a predetermined value. Herein, the program/erase cycle number or the block erase rate may be used as a block state condition. Meanwhile, the block state condition can be a success rate of an erase operation, a program operation, or a read operation.

If the program/erase cycle number or the block erase rate is not below the predetermined value, the method proceeds to operation S460. On the other hand, the program/erase cycle number or the block erase rate is below the predetermined value, in operation S440, a quick erase operation may be performed to perform a next program operation of the memory block. Herein, memory cells of the quickly erased memory block may be set to a pseudo erase state Pseudo E.

Afterwards, in operation S450, an overwrite operation or a program operation may be performed using the pseudo erase state Pseudo E. Herein, the overwrite operation or the program operation may be a program operation in which 1-bit data is stored at a cell. In operation S460, the memory controller 400 may perform a normal erase operation on the memory block to perform a normal 1-bit program operation using an erase state E. Afterwards, the procedure may return to operation S410.

As described above, the quick erase operation may be determined in view of a state of a memory block.

In FIG. 18, a nonvolatile memory device 300 may include a single-level cell area 311 and a multi-level cell area 312. However, the inventive concept is not limited thereto. The inventive concept may separately include a nonvolatile memory device having only a single-level cell area 311 for buffering page data.

Figure 21:
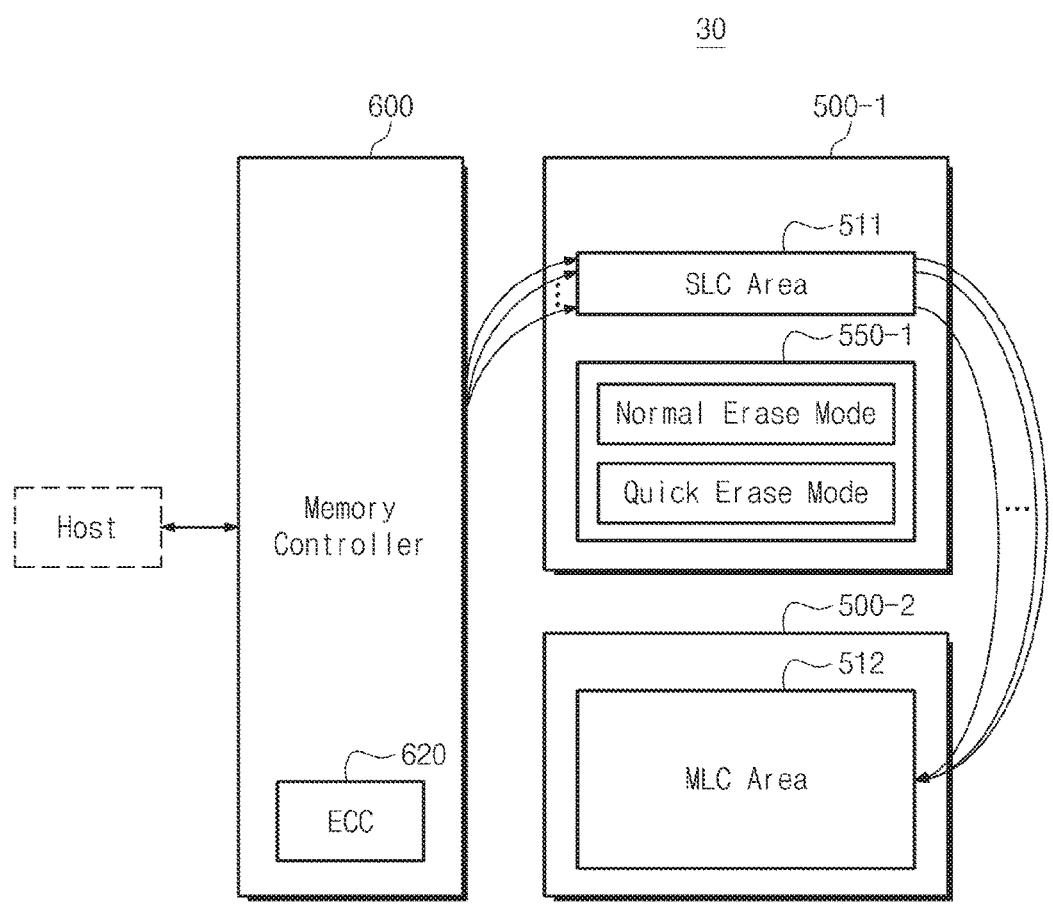
FIG. 21 is a block diagram schematically illustrating a memory system using an OBP scheme according to another embodiment of the inventive concept.

FIG. 21 is a block diagram schematically illustrating a memory system using an OBP scheme according to another embodiment of the inventive concept. Referring to FIG. 21, a memory system 30 may include a first nonvolatile memory device 500-1, a second nonvolatile memory device 500-2, and a memory controller 400. The first nonvolatile memory device 500-1 may include a single-level cell area 511 and control logic 550-1. The second nonvolatile memory device 500-2 may include a multi-level cell area 512.

In the memory system 30, page data may be buffered by the single-level cell area 511 of the first nonvolatile memory device 500-1, and the buffered data may be programmed at the multi-level cell area 512 of the second nonvolatile memory device 500-2. Herein, the single-level cell area 511 may include memory blocks which are erased according to a quick erase mode or a normal erase mode.

Figure 22:
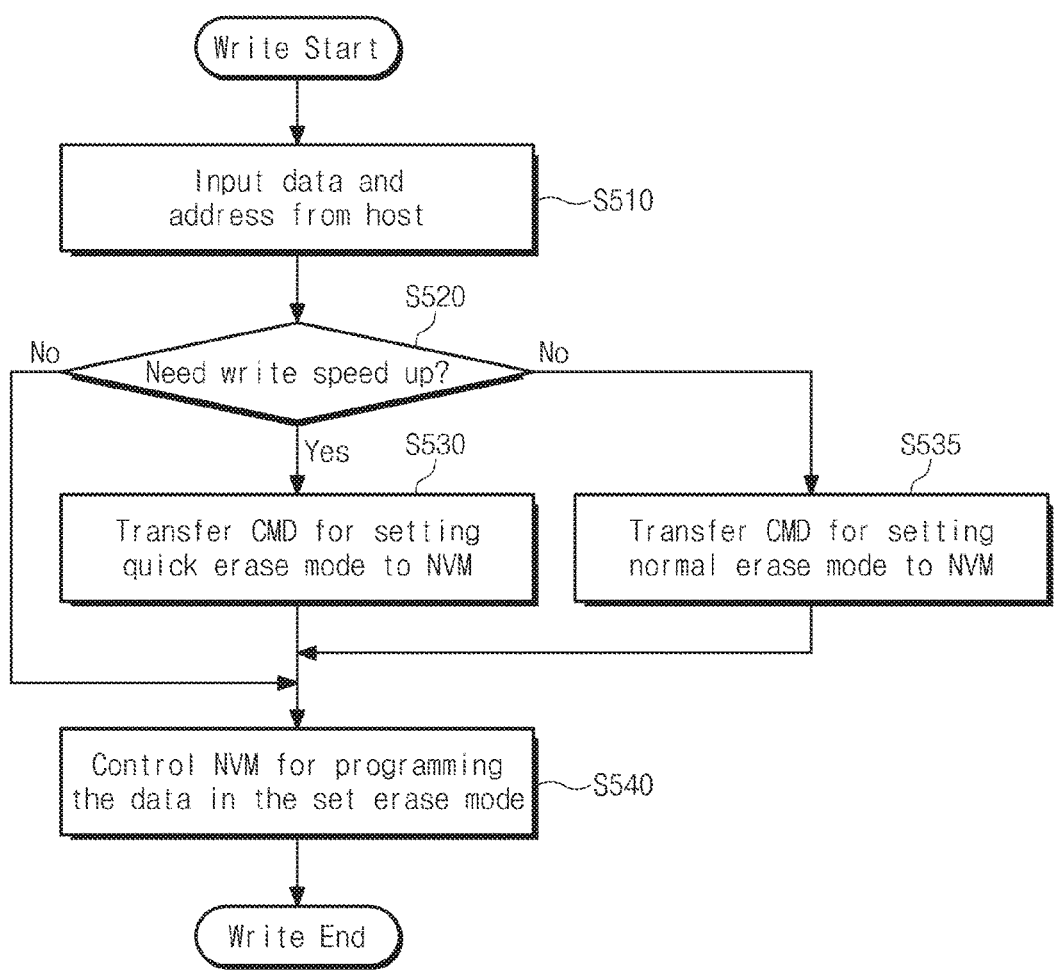
FIG. 22 is a flow chart illustrating a write operation of a memory system according to an embodiment of the inventive concept.

FIG. 22 is a flow chart illustrating a write operation of a memory system according to an embodiment of the inventive concept.

In operation S510, a write request may be provided to a memory system from a host. At this time data and an address (a logical address) may be received. In operation S520, the memory system may determine whether an increase in a write speed is required. Herein, an operation of determining whether an increase in a write speed is required may be determined in accordance with a request of the host. In example embodiments, an operation of determining whether an increase in a write speed is required may be decided according to information associated with input data. For example, in the case that input data is mass data, the write request may be determined to require a fast write speed.

If there is a need to increase a write speed, in operation S530, the memory controller 400 may provide the nonvolatile memory device with a command for setting a quick erase mode. After the quick erase mode is set according to the command, the nonvolatile memory device may perform a quick erase operation in response to an erase command.

Meanwhile, if there is no need to increase a write speed, in operation S535, the memory controller may provide the nonvolatile memory device with a command for setting a normal erase mode. After the normal erase mode is set according to the command, the nonvolatile memory device may perform a quick erase operation in response to an erase command. Mode setting of the inventive concept may not be limited to this disclosure. The normal erase mode may be a default erase mode of the nonvolatile memory device. That is, the normal erase mode may not need a mode setting procedure.

In operation S540, the memory controller may control the nonvolatile memory device such that the input data is programmed at the set erase mode.

As described above, a quick erase operation may be determined according to whether an increase in a write speed is required.

With the quick erase operation of the inventive concept, a memory cell may be set to a pseudo erase state Pseudo E below a least state LS (refer to FIG. 1). However, the inventive concept is not limited thereto. For example, the quick erase operation may use previous program states as a pseudo erase state Pseudo E without an additional erase operation.

The quick erase operation may not be limited to form the pseudo erase state Pseudo E. It is possible to apply an erase voltage which is higher than that of a normal erase operation or to apply more cycles within a limited time.

The inventive concept is applicable to various devices.

Figure 23:
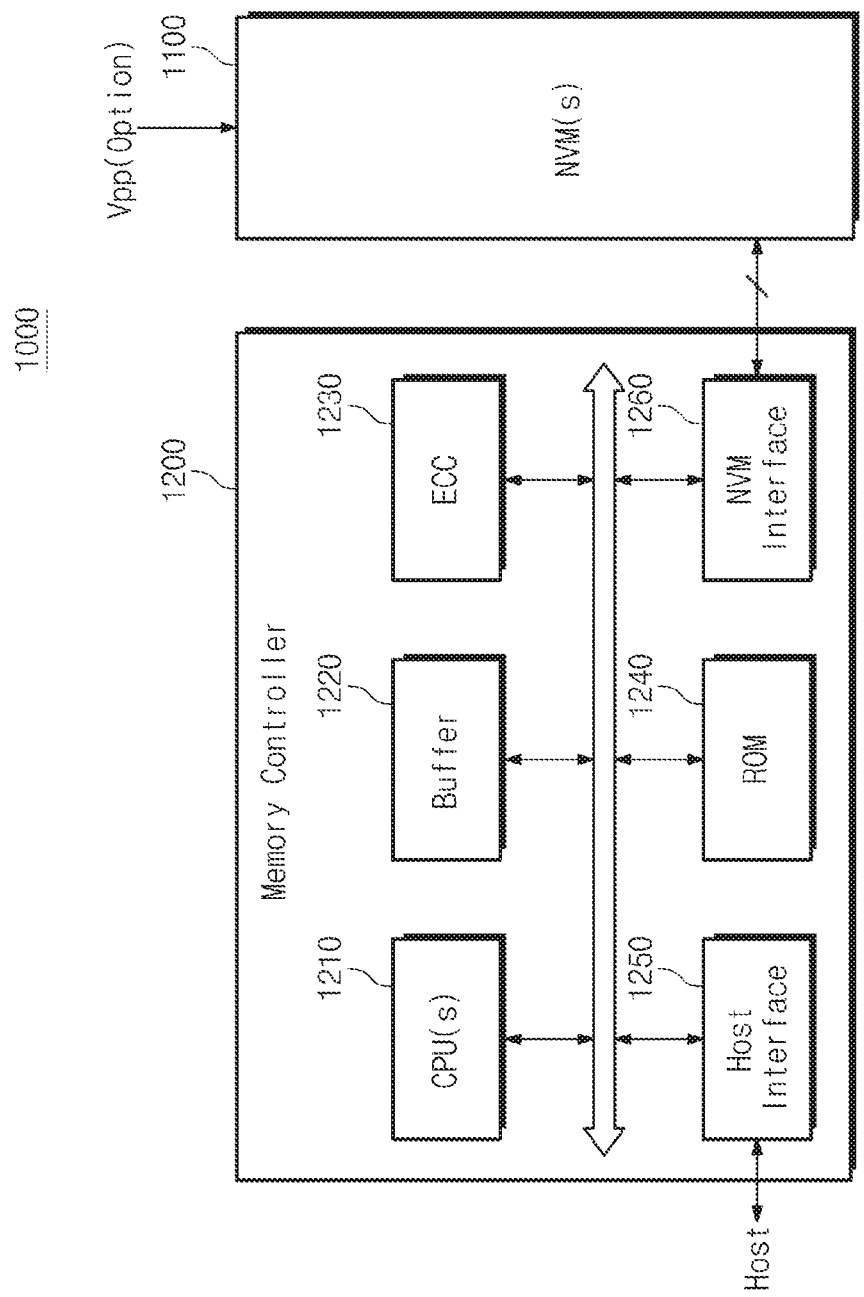
FIG. 23 is a block diagram schematically illustrating a memory system according to an embodiment of the inventive concept.

FIG. 23 is a block diagram schematically illustrating a memory system according to an embodiment of the inventive concept. Referring to FIG. 23, a memory system 1000 may include at least one nonvolatile memory device 1100 and a memory controller 1200. The nonvolatile memory device 1100 may be configured to perform a quick erase operation described with reference to FIGS. 1 to 22.

The nonvolatile memory device 1100 may be optionally supplied with a high voltage Vpp from the outside. The memory controller 1200 may be connected with the nonvolatile memory device 1100 via a plurality of channels. The memory controller 1200 may include at least one Central Processing Unit (CPU) 1210, a buffer memory 1220, an ECC circuit 1230, a ROM 1240, a host interface 1250, and a memory interface 1260. Although not shown in FIG. 23, the memory controller 1200 may further comprise a randomization circuit that randomizes and de-randomizes data. The memory system 1000 according to an embodiment of the inventive concept is applicable to a perfect page new (PPN) memory.

The memory controller 1200 may generate a data recovery command when a program operation of the nonvolatile memory device 1100 is failed or when the reliability of a program operation is required, and may provide the data recovery command to the nonvolatile memory device 1100.

The memory controller 1200 may include the ECC circuit 1230 which is configured to correct an error of data according to an error correction code (ECC). The ECC circuit 1230 may calculate an error correction code value of data to be programmed at a write operation and correct an error of data read at a read operation based on the error correction code value. The memory controller 1200 may provide the nonvolatile memory device 1100 with a program command such that data recovered at a data recovery operation is programmed at another physical page.

In the memory system 1000 of the inventive concept, it is possible to rapidly store mass data necessitating a fast write speed through a quick erase operation.

Figure 24:
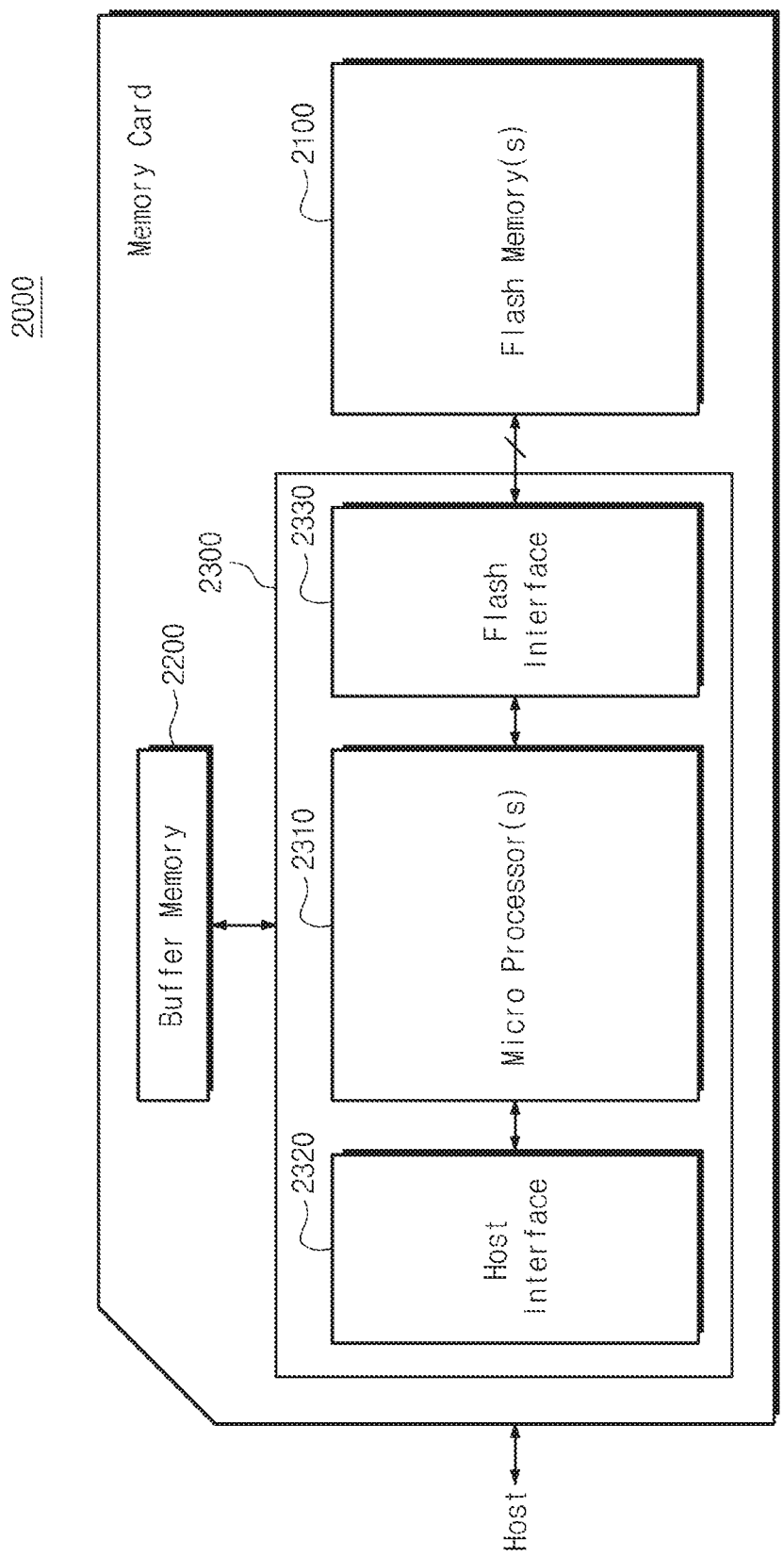
FIG. 24 is a block diagram schematically illustrating a memory card according to an embodiment of the inventive concept.

FIG. 24 is a block diagram schematically illustrating a memory card according to an embodiment of the inventive concept. Referring to FIG. 24, a memory card 2000 may include at least one flash memory 2100, a buffer memory device 2200, and a memory controller 2300 for controlling the flash memory 2100 and the buffer memory device 2200. The memory card 2000 may be configured to perform a quick erase operation which is described with reference to FIGS. 1 to 22.

The flash memory 2100 may be optionally supplied with a high voltage Vpp from the outside. The buffer memory device 2200 may be used to temporarily store data generated during an operation of the memory card 2000. The buffer memory device 2200 may be implemented by a DRAM or an SRAM. The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330. The microprocessor 2310 may be configured to drive firmware. The host interface 2320 may interface with the host via a card protocol (e.g., SD/MMC) for data exchanges between the host and the memory card 2000.

The memory card 2000 is applicable to Multimedia Cards (MMCs), Security Digitals (SDs), miniSDs, memory sticks, smart media, Trans-flash cards, and the like.

Figure 25:
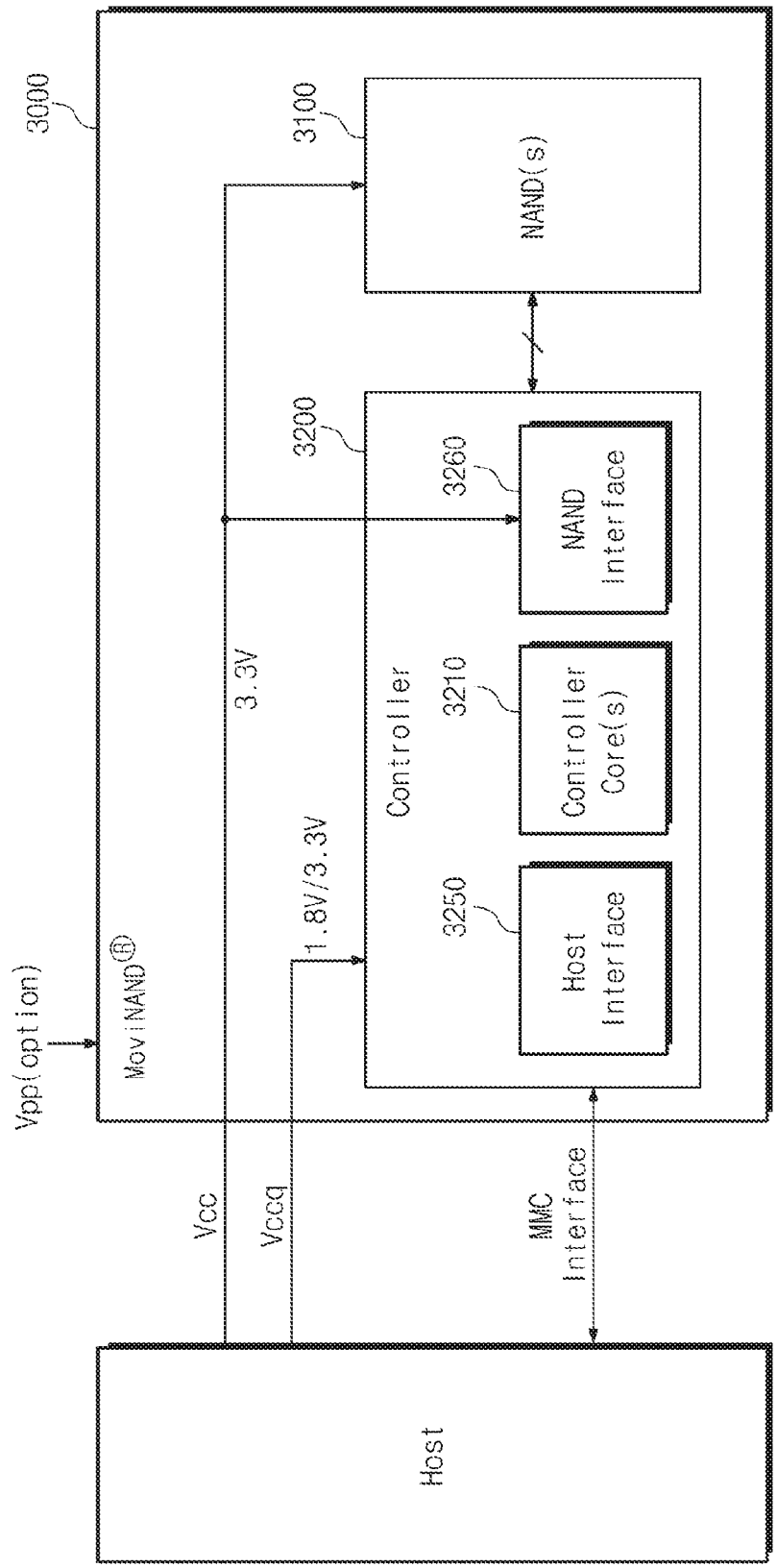
FIG. 25 is a block diagram schematically illustrating a moviNAND according to an embodiment of the inventive concept.

FIG. 25 is a block diagram schematically illustrating a moviNAND® according to an embodiment of the inventive concept. Referring to FIG. 25, a moviNAND® device 3000 may include at least one NAND flash memory device 3100 and controller 3200. The moviNAND® device 3000 may support the MMC 4.4 (or, referred to as "eMMC") standard. The moviNAND® 3000 may be configured to perform a quick erase operation which is described with reference to FIGS. 1 to 22.

The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.).

The controller 3200 may be connected with the flash memory device 3100 via a plurality of channels. The controller 3200 may include at least one controller core 3210, a host interface 3250, and a NAND interface 3260. The controller core 3210 may control an overall operation of the moviNAND® device 3000. The host interface 3250 may be configured to perform an interface between the controller 3210 and a host. The NAND interface 3260 may be configured to provide an interface between the NAND flash memory device 3100 and the controller 3200. In example embodiments, the host interface 3250 may be a parallel interface (e.g., an MMC interface). In other example embodiments, the host interface 3250 of the moviNAND® device 3000 may be a serial interface (e.g., UHS-II, UFS, etc.).

The moviNAND® device 3000 may receive power supply voltages Vcc and Vccq from the host. Herein, the power supply voltage Vcc (about 3.3V) may be supplied to the NAND flash memory device 3100 and the NAND interface 3260, and the power supply voltage Vccq (about 1.8V/3.3V) may be supplied to the controller 3200. In example embodiments, an external high voltage Vpp may be optionally supplied to the moviNAND® device 3000.

The moviNAND® device 3000 according to an embodiment of the inventive concept may be advantageous to store mass data, and may have an improved write characteristic. The moviNAND® device 3000 according to an embodiment of the inventive concept is applicable to small-sized and low-power mobile products (e.g., a Galaxy S, iPhone, etc.).

Figure 26:
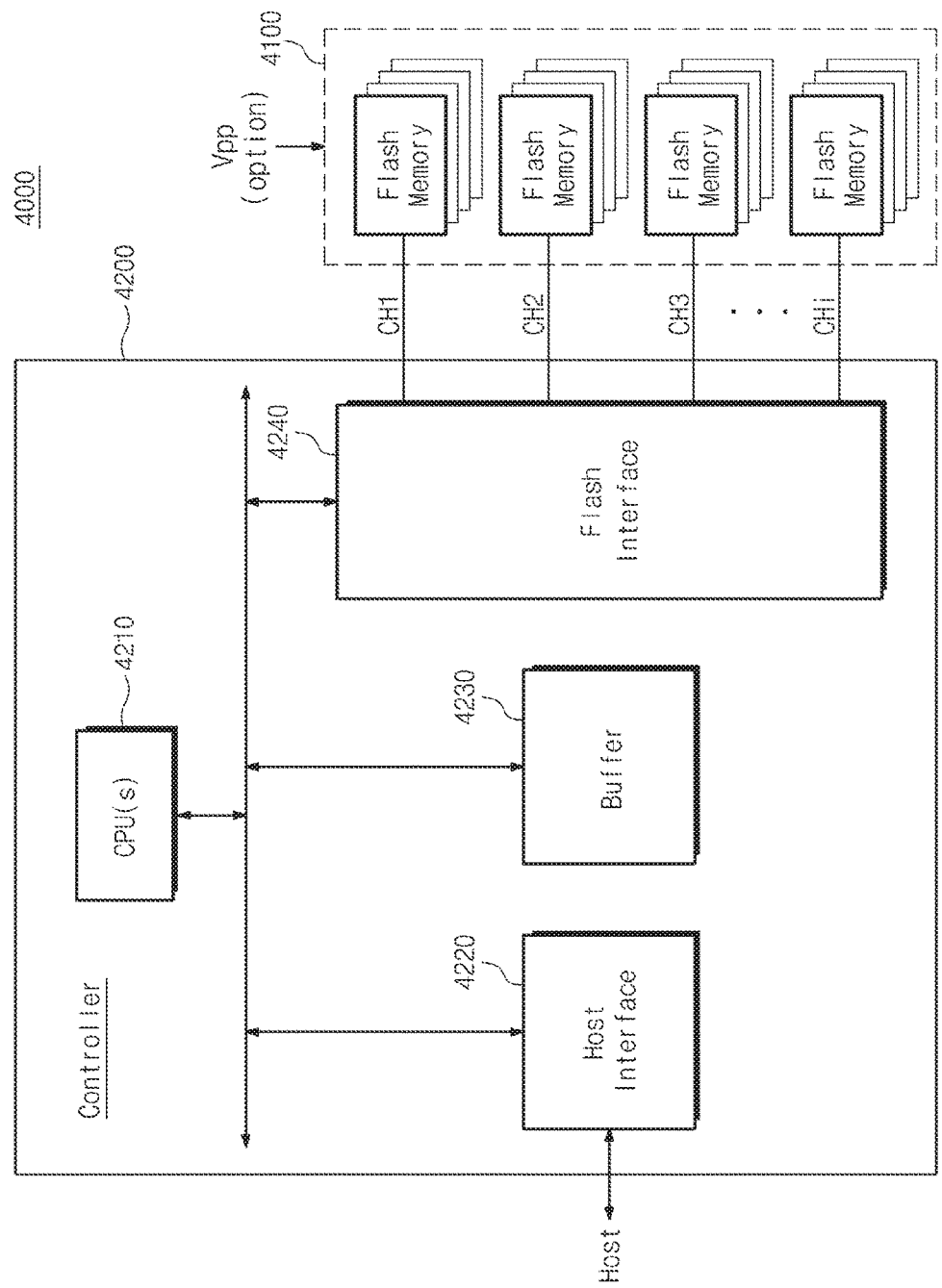
FIG. 26 is a block diagram schematically illustrating a solid state drive according to an embodiment of the inventive concept.

FIG. 26 is a block diagram schematically illustrating a solid state drive according to an embodiment of the inventive concept. Referring to FIG. 26, a solid state drive (SSD) 4000 may include a plurality of flash memory devices 4100 and an SSD controller 4200. The SSD 4000 may be configured to perform a quick erase operation which is described with reference to FIGS. 1 to 22.

The flash memory devices 4100 may be optionally supplied with an external high voltage Vpp. The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

The SSD 4000 according to an embodiment of the inventive concept may improve the reliability of stored data by performing a concentration program operation for reducing power consumption at generation of heat. A more detailed description of the SSD 4000 is disclosed in U.S. Pat. Nos. 7,802,054, 8,027,194, and 8,122,193 and U.S. Patent Application Publication Nos. 2007/0106836 and US 2010/0082890, the entireties of which are herein incorporated by references.

Figure 27:
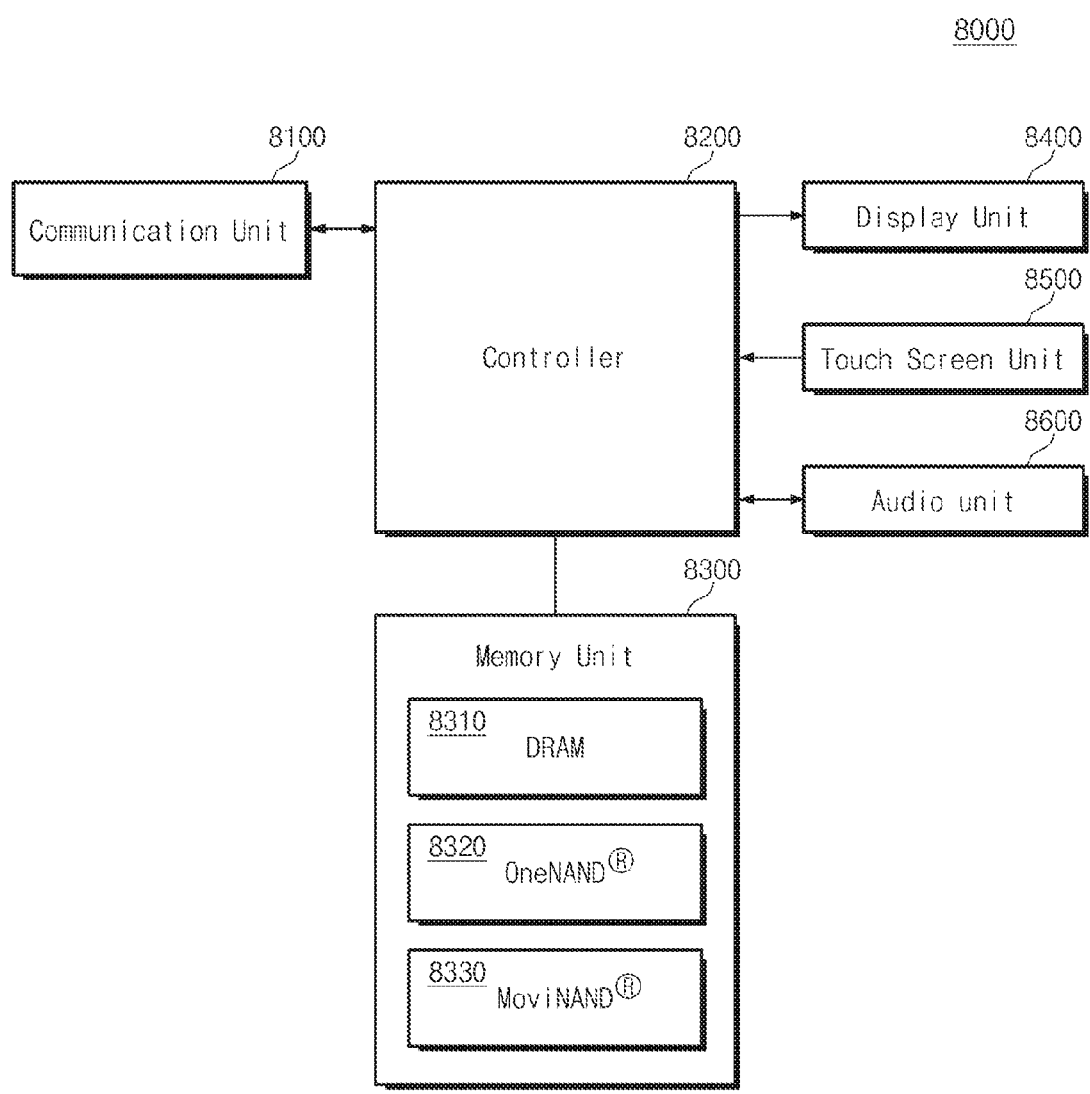
FIG. 27 is a block diagram schematically illustrating a mobile device according to an embodiment of the inventive concept.

FIG. 27 is a block diagram schematically illustrating a mobile device according to an embodiment of the inventive concept. Referring to FIG. 27, a mobile device 8000 may include a communication unit 8100, a controller 8200, a memory unit 8300, a display unit 8400, a touch screen unit 8500, and an audio unit 8600. The memory unit 8300 may include at least one DRAM 8310, at least one OneNAND® 8320, and at least one moviNAND® 8330. At least one of the OneNAND® 8320 and the moviNAND® 8330 may be configured to have the same configuration and operation as a memory system 1000 of FIG. 23.

Figure 28:
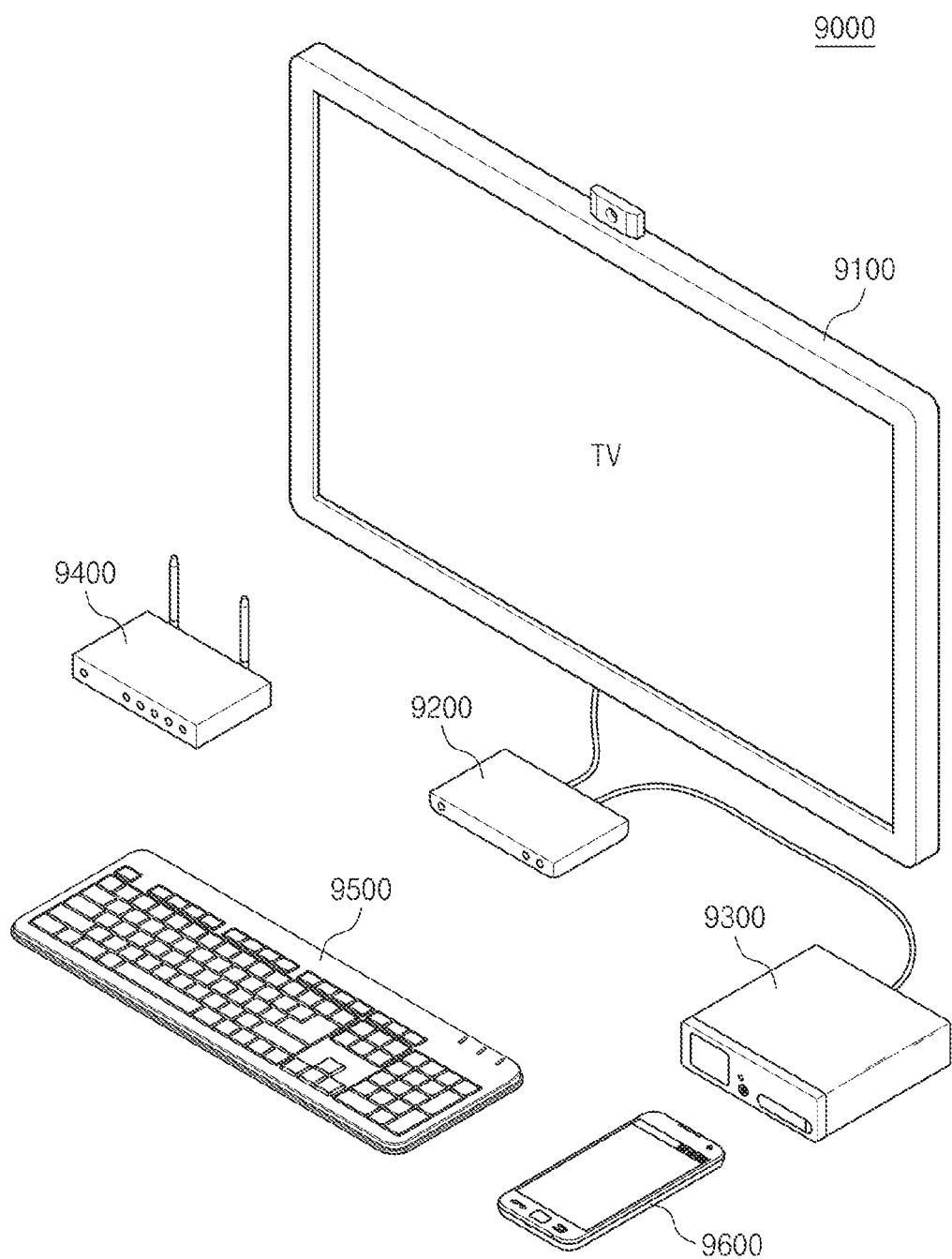
FIG. 28 is a block diagram schematically illustrating a smart TV system according to an embodiment of the inventive concept.

FIG. 28 is a block diagram schematically illustrating a smart TV system according to an embodiment of the inventive concept. Referring to FIG. 28, a smart TV system 9000 may include a smart TV 9100, a revue 9200, a set-top box 9300, a wireless router 9400, a keypad 9500, and a smart phone 9600. Wireless communication may be performed between the smart TV 9100 and the wireless router 9400. The smart TV 9100 may be connected with an internet through the revue 9200 being an open platform. The smart TV 9100 may enable a user to view cable and satellite broadcasting transferred through the set-top box 9300. The smart TV 9100 may be operated according to the control of the keypad 9500 or the smart phone 9600. The smart TV 9100 may include a memory system 1000 of FIG. 23.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-level Processed Stack Package (WSP), and so on.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A program method of a memory system which comprises a nonvolatile memory device including a plurality of memory blocks and a memory controller to control the nonvolatile memory device, the program method comprising:
  receiving data and an address corresponding to a memory block from among the plurality of memory blocks;
  determining whether an erase operation is needed on the memory block;
  determining whether a quick erase operation is needed, when the erase operation is needed;
  performing the quick erase operation on the memory block to form a pseudo erase state when the quick erase operation is needed;
  performing a normal erase operation on the memory block to form an erase state when the quick erase operation is not needed; and
  programming the memory block with the input data after said performing the quick erase operation and after said performing the normal erase operation,
  wherein the erase state is lower than a first erase verification level, the pseudo erase state is lower than a second erase verification level, and the second erase verification level is higher than the first erase verification level, wherein the quick erase operation is selected based on a success rate of erase operations, program operations, or read operations of the memory block.

2. The program method of claim 1, wherein the erase operation is determined as needed when the memory block has invalid data or garbage after a merge operation between the plurality of memory blocks and a free block is needed.

3. The program method of claim 1, wherein said programming is an M-bit program operation (M being a natural number) of the memory block using the erase state.

4. The program method of claim 1, wherein said programming is an N-bit program operation (N being a positive integer) of the memory block using the pseudo erase state.

5. The program method of claim 4, wherein during the N-bit program operation a threshold voltage of the pseudo erase state is higher than a threshold voltage of the erase state.

6. The program method of claim 4, wherein the N-bit program operation uses an extra state higher than a most significant state of an M-bit program operation (M being a natural number) using the erase state.

7. The program method of claim 4, wherein the N-bit program operation is a multi-dimension modulation scheme in which data to be stored is encoded and the encoded data is continuously programmed in memory cells of the memory block.

8. The program method of claim 1, wherein the memory block includes a three-dimensional (3D) array of memory cells.

9. The program method of claim 1, wherein the quick erase operation is selected when the success rate of erase operations, program operations, or read operations of the memory block is less than a predetermined value.

10. The program method of claim 1, wherein the quick erase operation is selected when the success rate of erase operations, program operations, or read operations of the memory block exceeds a predetermined value.

11. A memory system, comprising:
at least ne nonvolatile memory device; and
a memory controller configured to control the at least one nonvolatile memory device,
wherein the at least one nonvolatile memory device comprises
a first memory cell array including first memory blocks each having a plurality of first memory cells at which page data is stored by 1-bit programming,
a second memory cell array including second memory blocks each having a plurality of second memory cells, a plurality of page data in the first memory cell array being stored at a page of the second memory cells by multi-bit programming, and control logic configured to erase the first memory blocks using one of a first erase mode and a second erase mode, and to erase the second memory blocks using the first erase mode, wherein the first erase mode is used to set the first memory cells or the second memory cells to an erase state, and the second erase mode is used to set the first memory cells to a pseudo erase state, wherein the erase state is lower than a first erase verification level, the pseudo erase state is lower than a second erase verification level, and the second erase verification level is higher than the first erase verification level, and wherein the second erase mode is selected based on a success rate of erase operations, program operations, or read operations of the first memory blocks.

12. The memory system of claim 11, wherein each of the first memory blocks in the first memory cell array performs a 1-bit program operation using the erase state and then performs a 1-bit program operation using the pseudo erase state.

13. The memory system of claim 11, wherein the second erase mode is selected when the success rate of erase operations, program operations, or read operations of the first memory blocks is less than a predetermined value.

14. The memory system of claim 11, wherein the second erase mode is selected when the success rate of erase operations, program operations, or read operations of the first memory blocks exceeds a predetermined value.

15. The memory system of claim 11, wherein the memory controller comprises an error correction code circuit configured to correct an error of a plurality of pages of data read from the first memory cell array when the plurality of pages of data of the first memory cell array is multi-bit programmed for the page.

16. The memory system of claim 11, wherein the second erase mode applies an erase voltage which is lower than a level of an erase voltage of the first erase mode, and performs a part of erase cycles of the first erase mode, a part of one of the erase cycles of the first erase mode, erase cycles which are shorter than the erase cycles of the first erase mode, a part of the erase cycles which are shorter than the erase cycles of the first erase mode, or a part of one of the erase cycles which are shorter than the erase cycles of the first erase mode.

17. The memory system of claim 11, wherein at least one of the first and second memory cell arrays is a three-dimensional (3D) memory cell array.

18. The memory system of claim 17, wherein the 3D memory cell array comprises a plurality of memory cells, each of the memory cells including a charge trap layer.

19. The memory system of claim 17, wherein the 3D memory cell array includes a plurality of pillars penetrating at least one ground selection line, a plurality of word lines, and the at least one string selection line.

* * * * *